United States Patent [19]

Dolby et al.

[11] 3,978,409

[45] Aug. 31, 1976

[54] SIGNAL COMPRESSORS AND EXPANDERS

[75] Inventors: Ray Milton Dolby; Paul Anthony Spencer, both of San Francisco, Calif.

[73] Assignee: Dolby Laboratories, Inc., San Francisco, Calif.

[22] Filed: June 7, 1974

[21] Appl. No.: 477,205

Related U.S. Application Data

[63] Continuation-in-part of Ser. No. 346,689, March 30, 1973, abandoned.

[30] Foreign Application Priority Data

Apr. 4, 1972 United Kingdom............... 15484/72

[52] U.S. Cl............................. 325/62; 179/15 AV; 325/65; 328/169; 333/14; 358/36; 360/24
[51] Int. Cl.².......................................... H04B 1/62
[58] Field of Search..................... 358/4–9, 358/36; 179/1 P, 15 AV; 360/24; 333/14, 18 T; 328/168, 169; 325/62, 65, 473–476; 178/DIG. 12

[56] References Cited
UNITED STATES PATENTS

| | | | |
|---|---|---|---|
| 3,117,278 | 1/1964 | Johnson................................ | 325/65 |
| 3,875,584 | 4/1975 | Fletcher et al........................ | 358/36 |

*Primary Examiner*—Robert L. Griffin
*Assistant Examiner*—Marc E. Bookbinder
*Attorney, Agent, or Firm*—Robert F. O'Connell

[57] ABSTRACT

The invention concerns a dynamic range compressor type encoder or expander type decoder, in which a main signal component in a main path is boosted or bucked by a further signal component derived from a point in the main path by a further path having the characteristics of so restricting the further signal component that the boosting or bucking action is only appreciable below a low level threshold. In the present invention the further signal component is a difference signal formed between a direct signal derived from a point in the main path and a delayed version of either the same signal or of another signal derived from another point in the main path. At the frequency equal to the reciprocal of the delay, and at harmonics of this frequency, the direct and delayed signals cancel. The compressor or expander action, and hence noise reduction action, takes place only at intervening frequencies. The invention enables carrier components or other repetitive components of signals to be excluded from the compressor or expander action (which they would otherwise choke).

59 Claims, 31 Drawing Figures

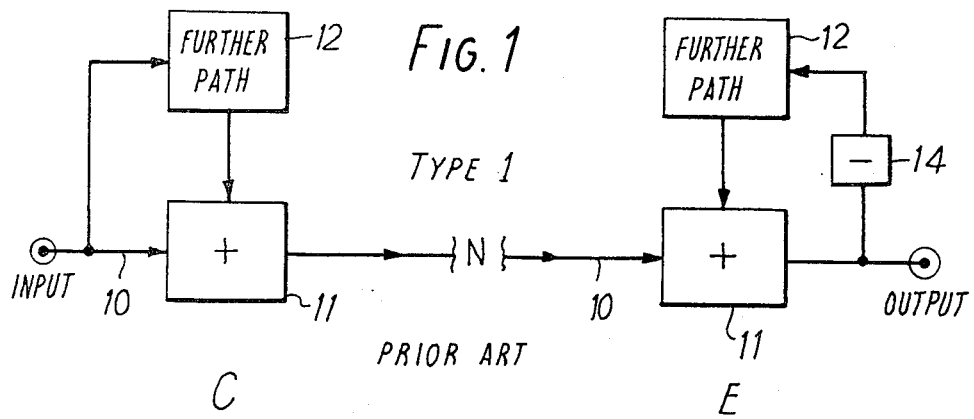
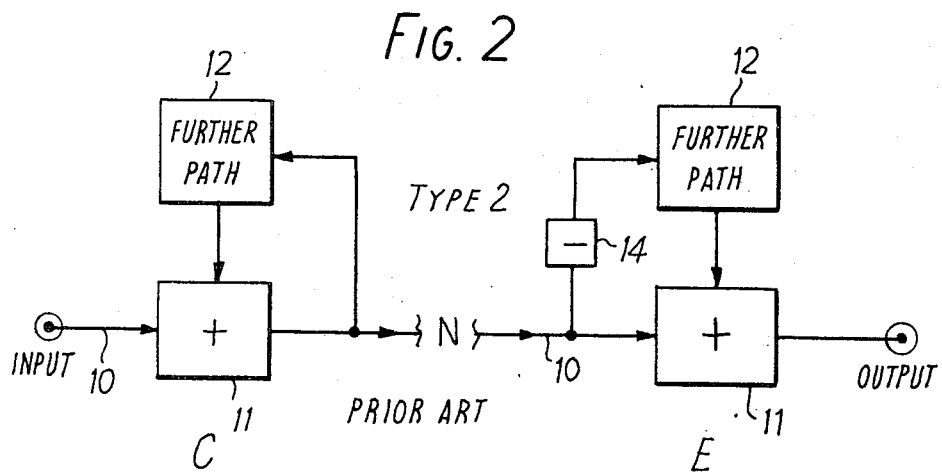
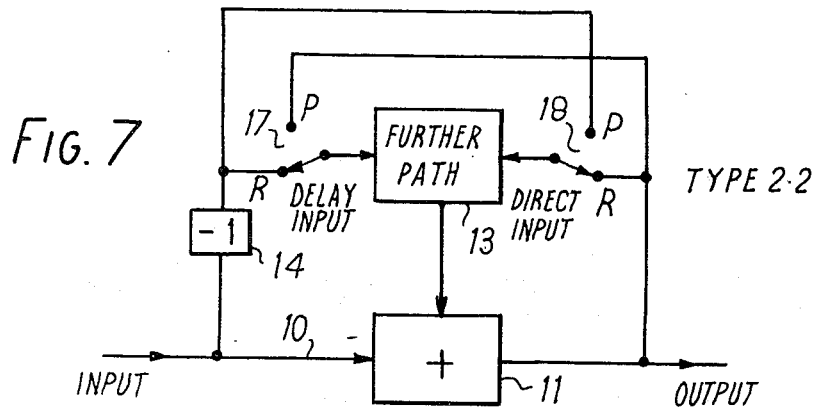

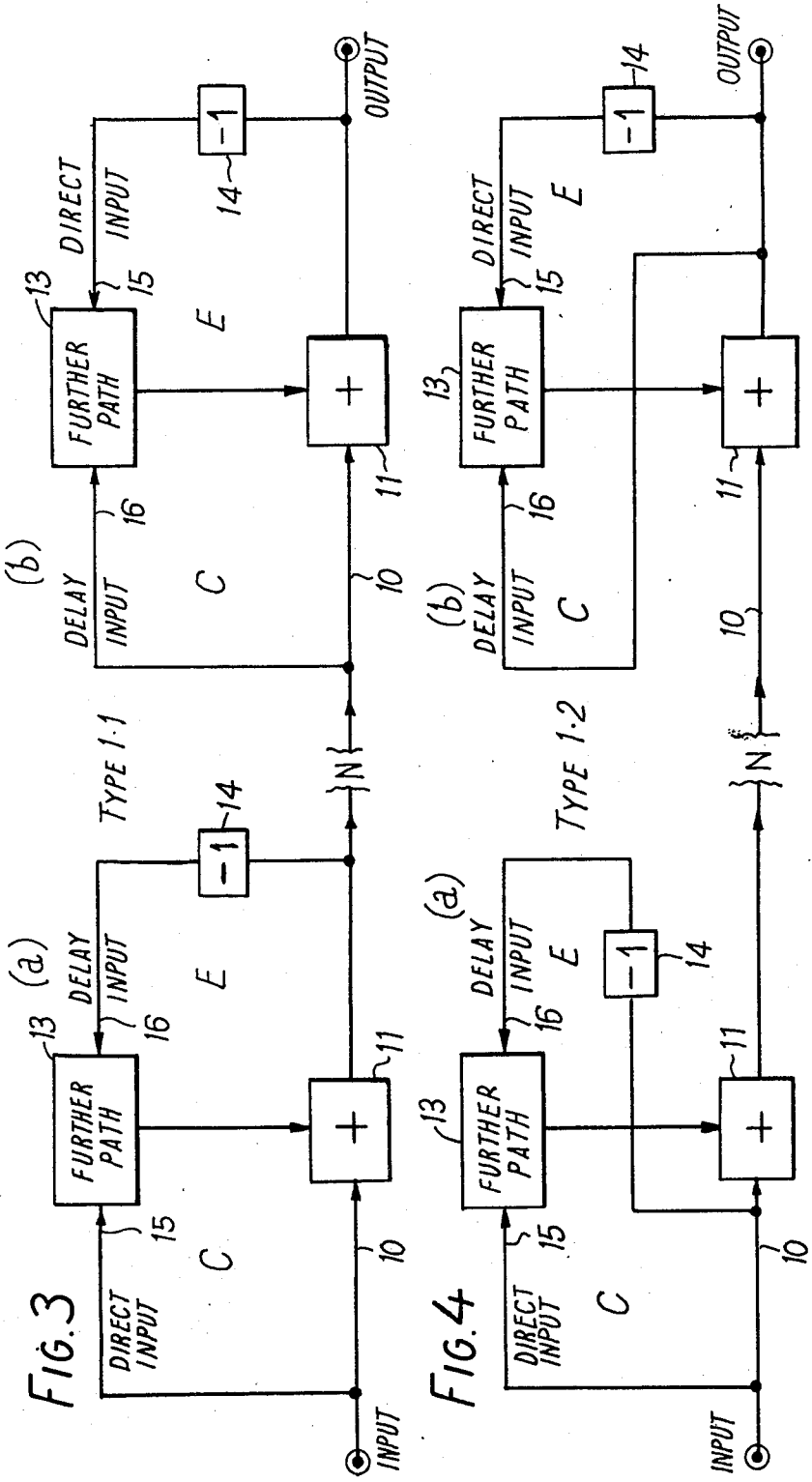

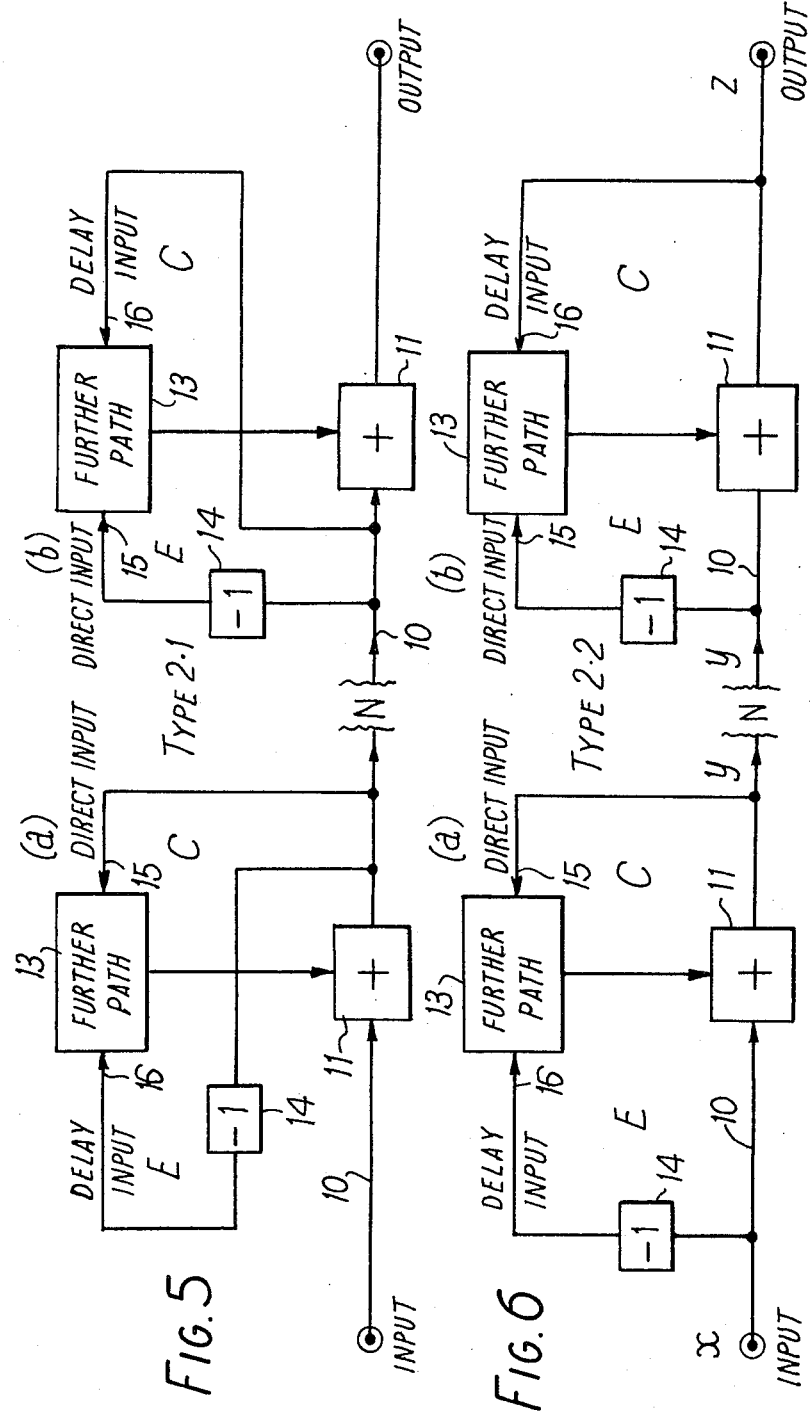

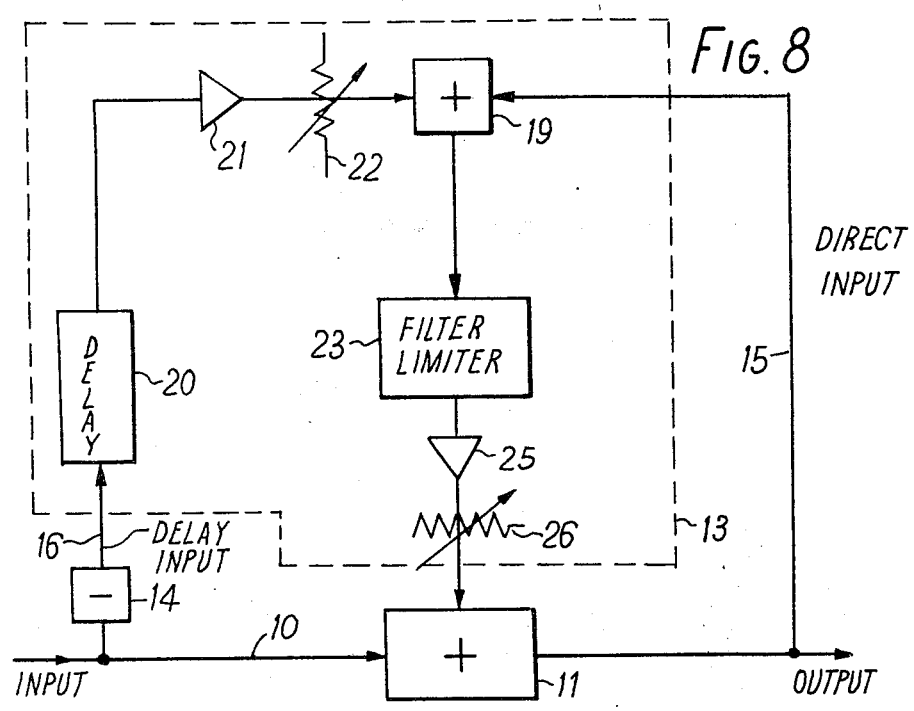
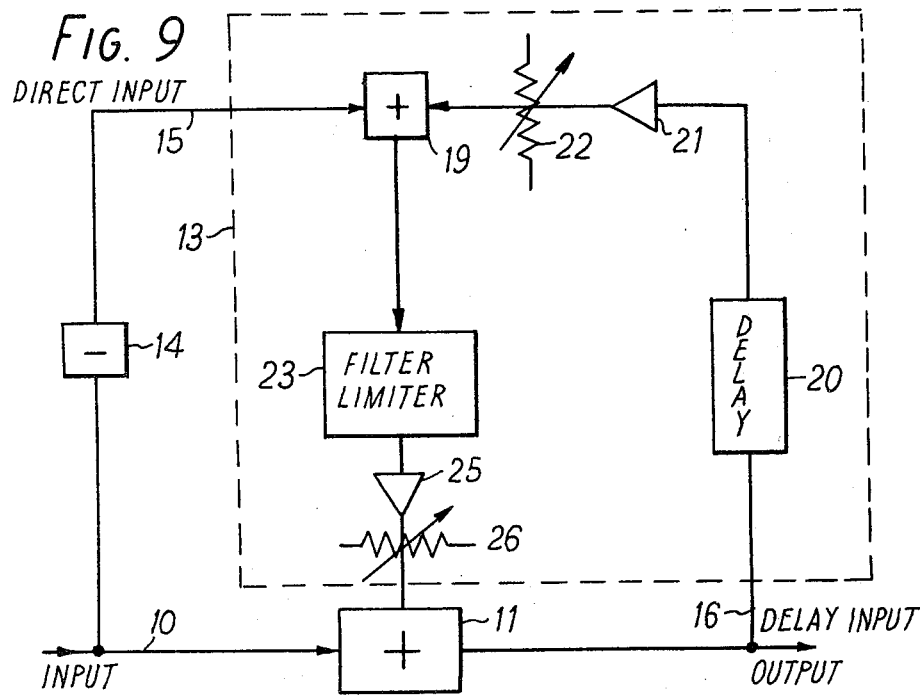

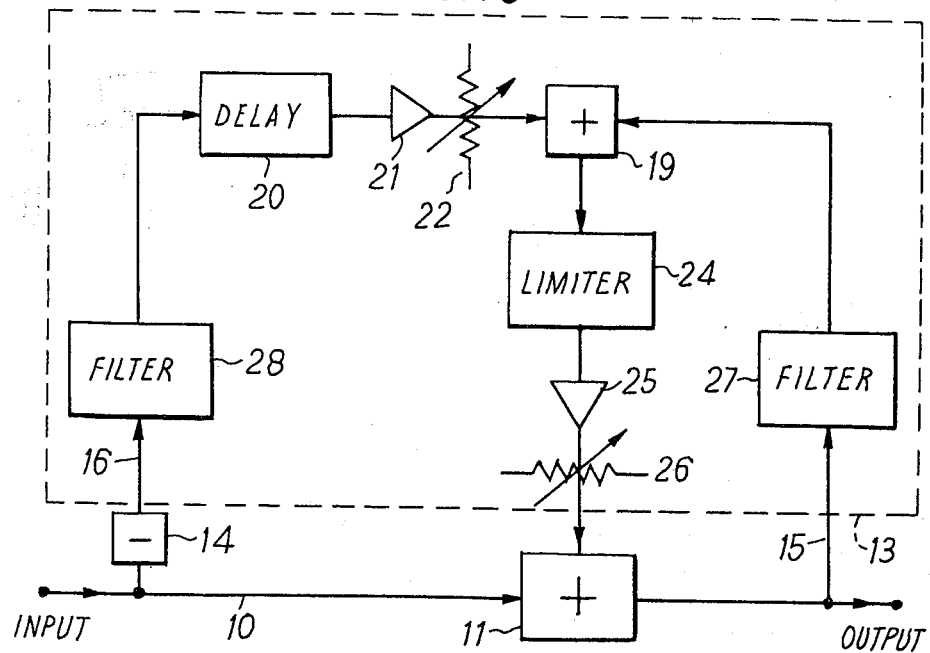
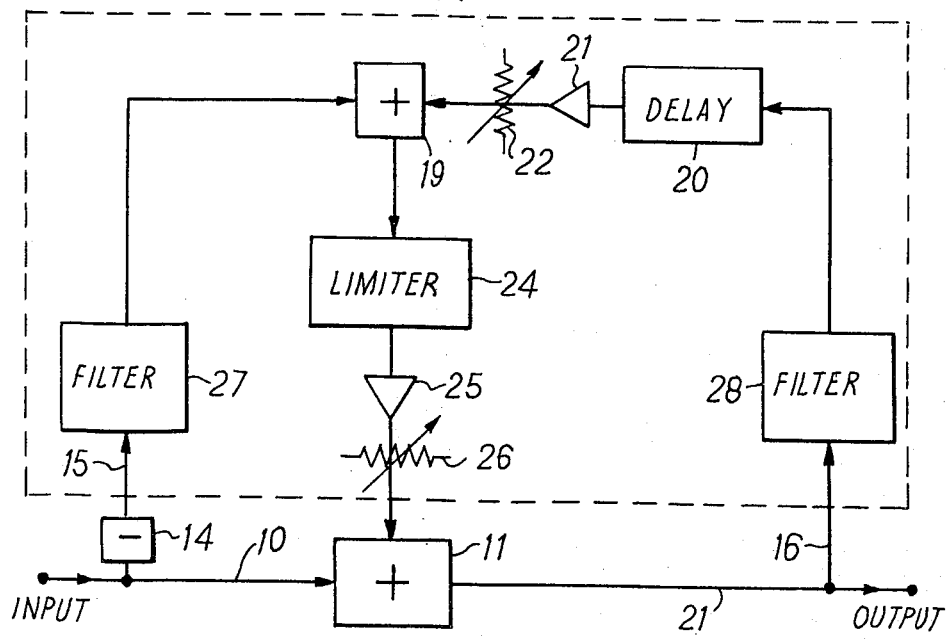

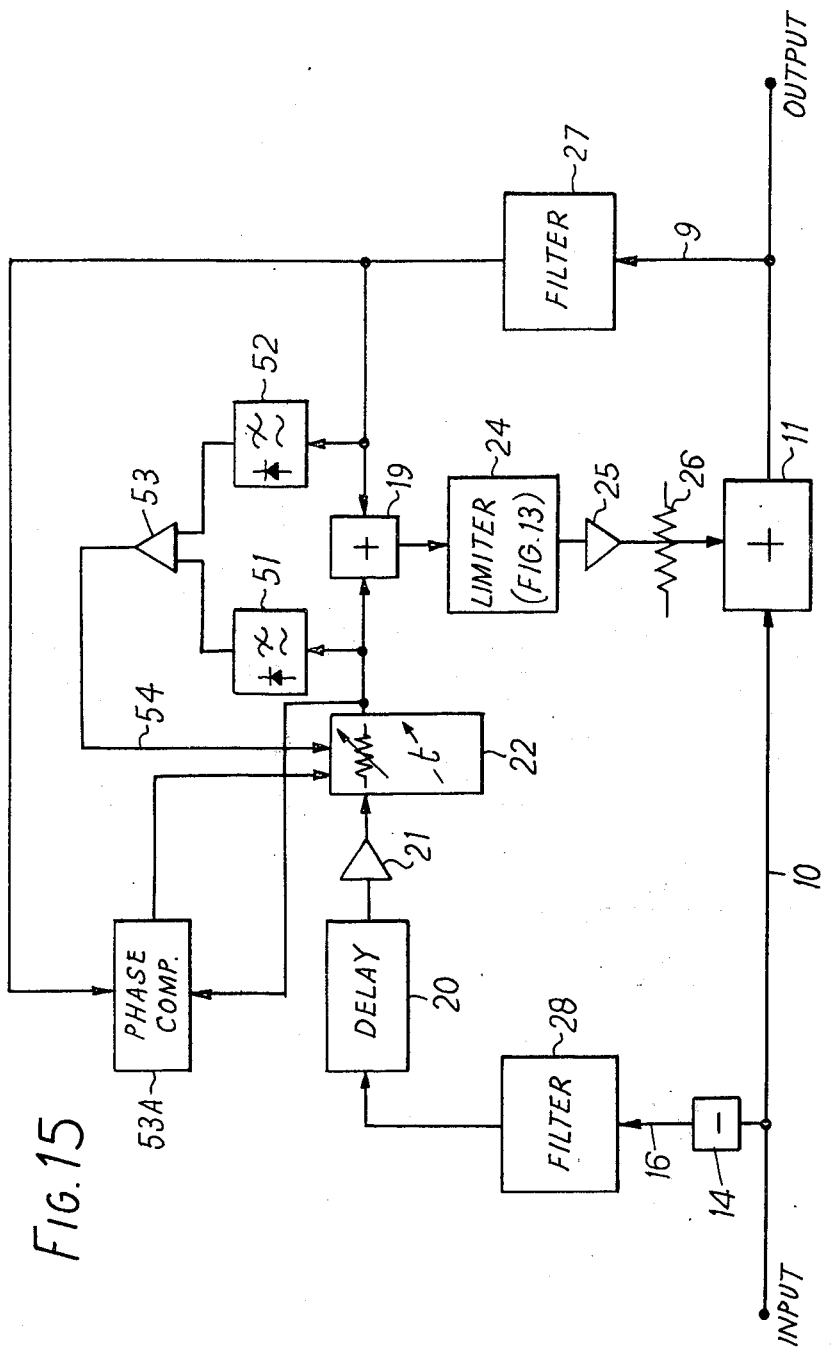

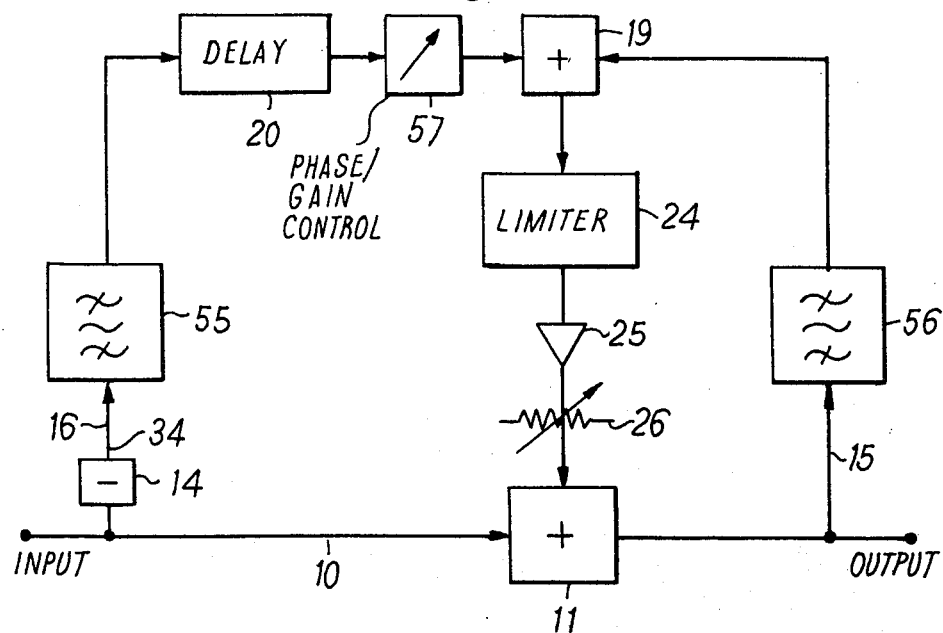
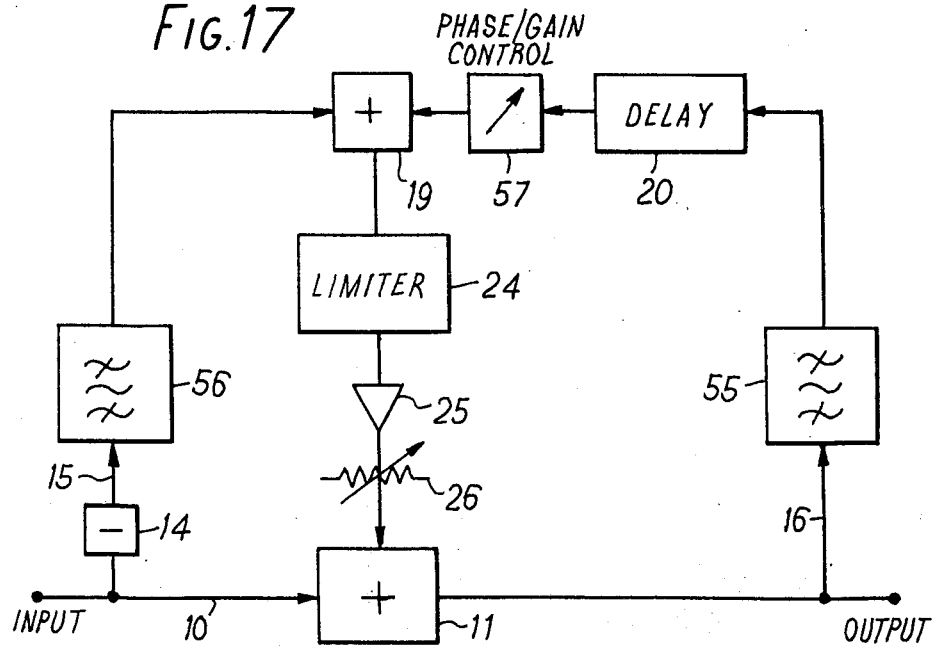

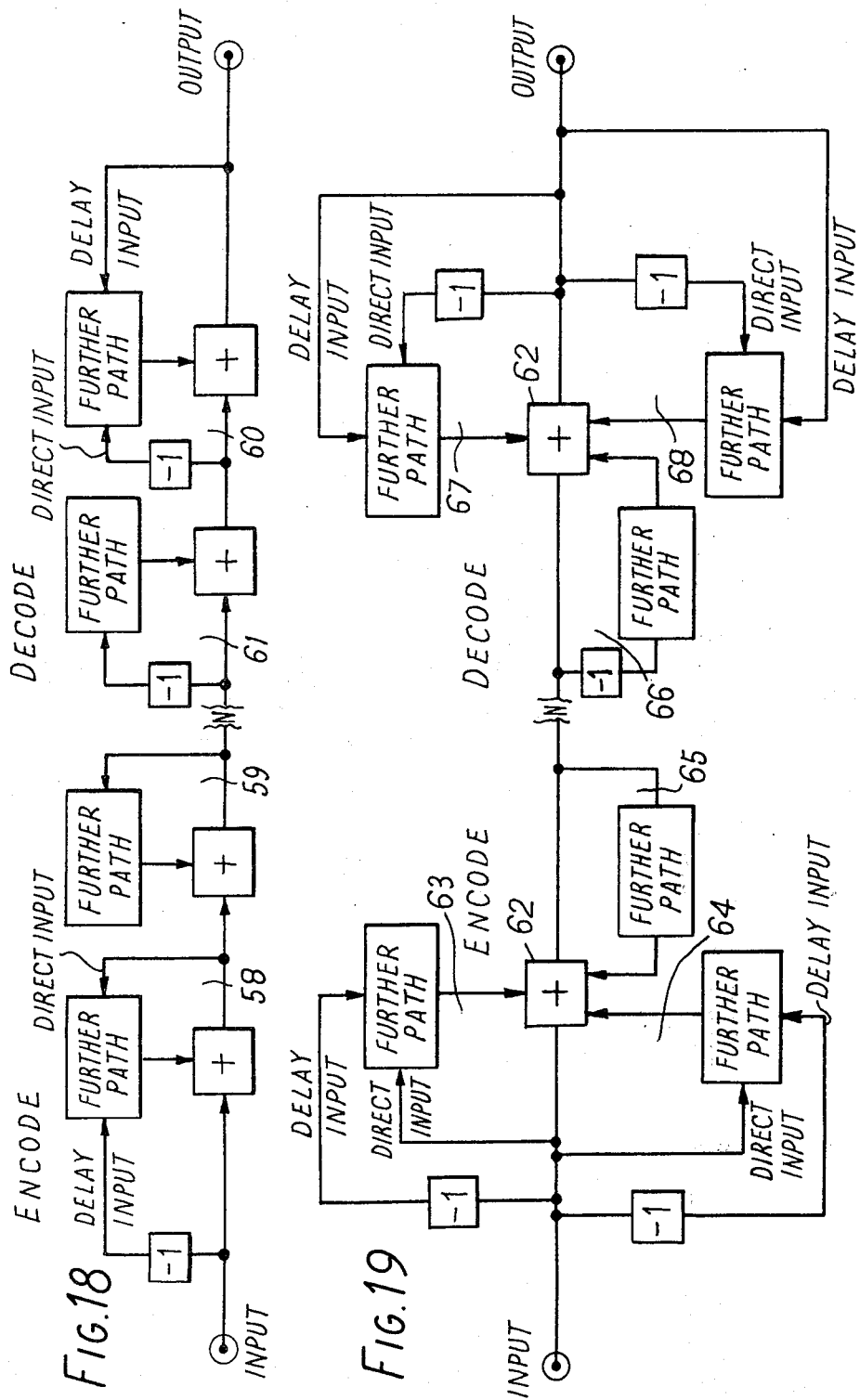

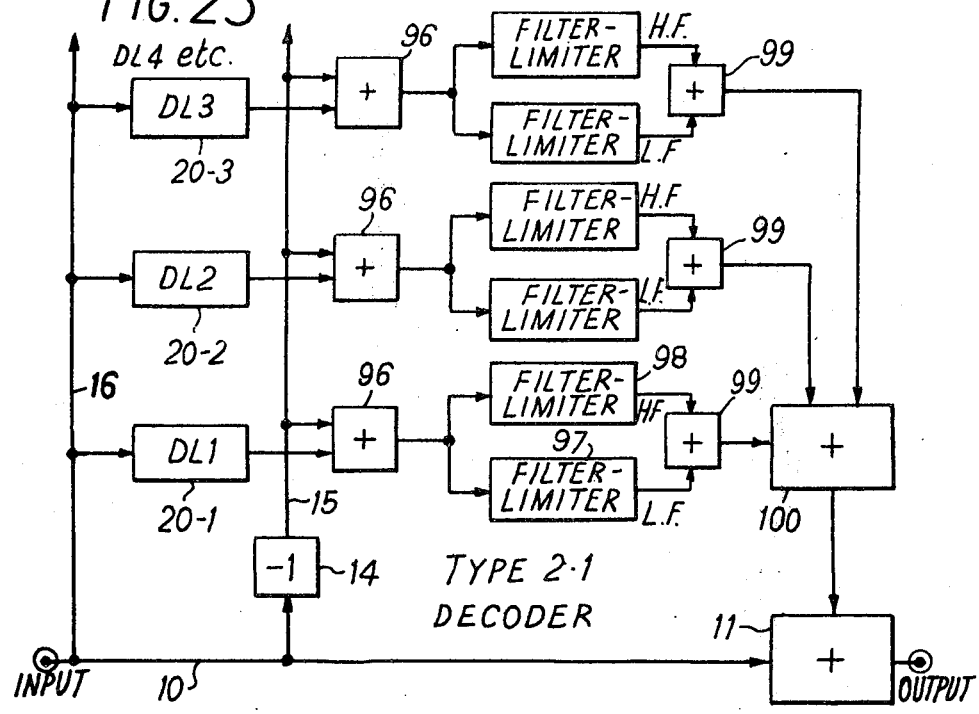
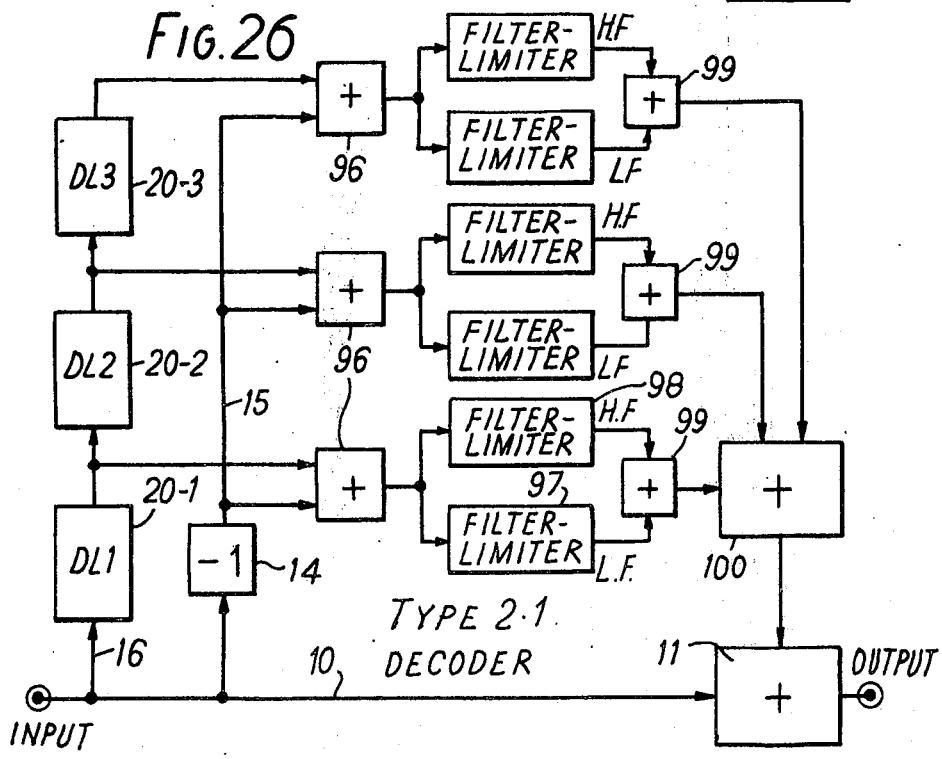

SIGNAL COMPRESSORS AND EXPANDERS

This application is a Continuation-in-Part of our application Ser. No. 346,689 filed Mar. 30, 1973, now abandoned.

This invention relates to signal encoding and decoding circuits the action of which are similar to those of the compressors and expanders described in British patent specifications Nos. 1,120,541 and 1,253,031, both in the name of Ray Milton Dolby, and to combined encoding/decoding circuits, i.e. noise reduction circuits. In such compressors and expanders a main signal component is transferred by a so-called main path from an input terminal to an output terminal, the main path having the characteristic at least of dynamic range linearity at any frequency within the band handled by the compressor or expander. The main path is preferably linear in all respects such that the main signal component is proportional on an instantaneous basis to the input signal. The main component is boosted in the case of a compressor or bucked in the case of an expander by one or more further components provided by so-called further paths, having one or more inputs connected to points in the main path and outputs connected to one or more combining means in the main path. The combining means combine the components in the sense appropriate to boosting or bucking, as the case may be.

Under low signal variation conditions, the further components significantly boost or buck the main component, to which end the further paths have suitable gain relative to the main path. However, the further paths have strong limiting characteristics. Each further path characteristic is generally linear up to a limiting threshold, which will usually be at least an order of magnitude (and preferably two orders of magnitude) below the nominal peak to peak signal level. The further components moreover do not under any conditions exceed a level which is greater than about one-tenth of the nominal peak to peak level of the main component. With large amplitude signals, the boosting or bucking action becomes insignificant with reference to the maximum signal amplitude, whereby a transfer characteristic which is linear with respect to dynamic range obtains.

The compressors (encoders) and expanders (decoders) based upon these principles are typically (though not necessarily) used together in complete noise reduction systems.

The main operative principle in the Applicant's signal processing devices is that a dynamically unmodified or main signal component is linearly combined with a dynamically modified component. The main signal component is derived from the input, and the modified component is produced by a dynamic modification circuit, the input of which is derived from one or more signals in the device, and ultimately from the input. The circuit realisations of this concept are many and varied, but the simplest for discussion purposes, as well as most straightforward in application, is the parallel path form; the paths are fed from conventional voltage inputs and produce conventional voltage outputs.

It is also possible to realise the invention in a series form, whereby the input signal may be applied as a current or a voltage to an impedance network, at least part of which is variable in response to one or more signals in the network. If a current is applied, the output signal is derived from the voltage across the network. If a voltage is applied, the output signal is derived from the current through the network. In practice, the same dynamic modification circuit is used as in the parallel path form; however, the input, output, and signal combining arrangements are such that the overall circuit can be thought of as a two-terminal impedance network or a series combination of two-terminal impedance networks. It is also possible to apply a current to a parallel combination of impedance networks, at least one of which is variable in response to one or more signals in the combination; the output signal is derived from the voltage across the combination or from the current through one or more of the impedance network branches.

Thus, the important feature of the invention is not so much the input, output, or combination methods, but that, in one way or another, a main or dynamically unmodified signal should be transferred from the input to the output, with subsequent signal accuracy and freedom from distortion; the dynamic modifications for noise reduction need take place only at low levels, which allows a boosting or buckling technique to be used, whether with voltages, currents or impedance components.

A problem which arises with any compressors or expanders is that the signal to be processed may include components which effectively block the compressing or expanding action. For instance, if the signal is a repetitive signal such as a video signal, the frequency spectrum contains substantial components at the picture and line repetition frequencies and harmonics thereof, e.g. 25 Hz and its harmonics and 15.625 KHz its harmonics in the case of a 625 line, 50 fields per second television signal. If such components are spread throughout any part of a band within which noise reduction is required, their presence may cause the output of the further path to limit, thereby blocking noise reduction action. For example, if noise reduction is attempted at low frequencies, large variation signal components are inevitably present at 25 Hz, 50 Hz, and so on and at 15.625 KHz, 31.250 KHz, and so on and the presence of these components will bring the limiting characteristics of the further paths into play and thereby prevent the significant boosting and bucking necessary to create the compressor and expander action.

The object of the present invention is to provide signal encoders and decoders capable of providing compressor and expander action in the presence of large variation signals which have a defined, and generally non-continuous, frequency spectrum. It will be convenient to refer to the encoders and decoders generically as circuits for modifying the dynamic range of a signal.

According to the present invention there is provided a circuit for modifying the dynamic range of a signal, comprising a main signal path arranged to transmit a main signal component with dynamic range linearity from an input terminal to an output terminal, and a further path including means for forming the difference signal between a signal derived from a point in the main path and a delayed version of a signal derived from a point in the main path, and an output connected to combining means in the main path so as to combine with the main component the said difference signal, which difference signal either boosts or bucks the main component appreciably under low signal variation conditions, and means for restricting the said difference signal to a predetermined amplitude which is not greater than about one-tenth of the level of the maximum amplitude of the main component.

In order to process a repetitive signal, the delay means introduces a delay period equal to the period of the fundamental repetition frequency, or an integral multiple of this frequency. Provided the gains via the two further path inputs are substantially equal, components at the fundamental repetition frequency and harmonics thereof (referred to together as the cancellation frequencies) will cancel out, i.e. will not appear in the said difference, and will accordingly not choke the encoder or decoder. As will be explained below, several different delays can be used, with delays which are different integral multiples of the aforesaid delay period.

In order to avoid the possibility of self oscillation, the present invention preferably employ the configuration described as Type 2 in British specification No. 1,253,031, in which the undelayed or direct further path input is connected, in the case of the encoder, to the output side of the combining means in the main path, and in the case of the decoder to the input side of these combining means. If the further path gain in this configuration is 0.684 below the aforementioned limiting threshold, the amount of compression or expansion varies from zero at the cancellation frequencies to a maximum of 14.5 dB at frequencies midway between adjacent cancellation frequencies.

For processing television signals, a suitable delay is one or more field periods, although this requires expensive delay means if adequate time-stability is to be achieved. Good results are also obtained using one or more line delays for both chrominance and luminance components in the case of NTSC signals (and two-line delays for chrominance and one-line delays for luminance in the case of PAL signals). It is furthermore possible to use closed loop control to maintain the delays at the correct values, as explained below.

The invention is not restricted to use of delays related to a repetition frequency. For example, the delays can be short compared with the periods of the major information components of a signal, which will thereby be excluded from the compressor or expander action. In a television system, such delays can range from a fraction of a microsecond to several microseconds, for example. The action of the invention will be confined to higher frequency components, such components typically including the major noise components required to be reduced by complementary compressor and expander action.

The invention will be described in more detail, by way of example, with reference to the accompanying drawings, wherein:

FIGS. 1 and 2 show the basic, known configurations of Type 1 and Type 2 compressors and expanders to assist in understanding the invention, FIGS. 3 to 6 show the basic configurations of four types of encoders and decoders embodying the present invention, FIG. 7 shows a switched version of FIG. 6 for providing either encoder or decoder action, FIGS. 8 and 9 show more detailed versions of the encoder and decoder of FIG. 6, FIGS. 10 and 11 show modified forms of FIGS. 8 and 9, FIGS. 12A and 12B illustrate compressor and expander characteristics suitable for a video signal, FIG. 13 shows a limiter circuit for obtaining a down-turning limiting characteristic, FIG. 14 is an explanatory diagram relating to FIG. 13, FIG. 15 shows a modified form of FIG. 10 in which automatic gain and/or phase control is applied to the delayed signal, FIG. 16 is a block diagram of an encoder suitable for use in a colour television system for the colour sub-carrier region, FIG. 17 is a diagram of the decoder complementary to FIG. 16, FIGS. 18 and 19 show how circuits may be combined to deal separately with different frequency bands, FIG. 20 shows a specific example of FIG. 18 for providing wide-band noise reduction in a monochrome television signal, FIG. 21 shows the encoding portion only of another example of FIG. 18 for providing wide-band noise reduction in a colour television signal;

FIGS. 25 and 26 illustrate further paths using multiple delays in parallel;

Figure 12A:
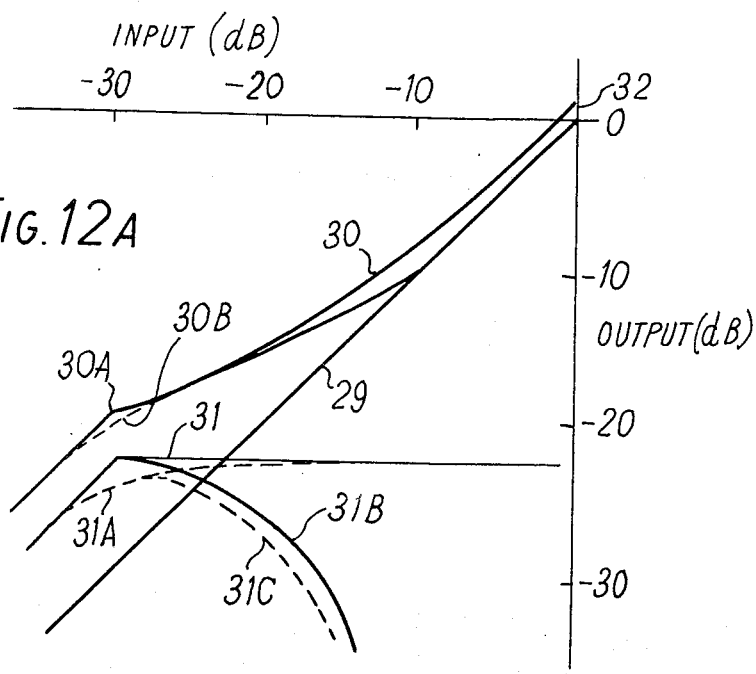

To simplify presentation of the invention the convention is adopted throughout the drawings that, wherever signals are combined they are combined, (i.e. mixed) additively (by blocks denoted "+") and inverters are shown (by blocks denoted "−") when subtractive combination is required. It will be appreciated that the same overall result may be achieved in various ways with inverters in places other than those shown and/or with the use of combining circuits such as differential amplifiers which actually do subtract one signal from the other. It is merely necessary that closed loops illustrated as inverting should, overall, remain inverting; that non-inverting loops should, overall, remain non-inverting; and that the results of combining signals should remain additive or subtractive, as the case may be.

In FIGS. 1 to 6, the symbols C and E denote compressors and expanders. In FIGS. 1 and 2 the compressors and expanders are the encoders and decoders respectively. In FIGS. 3 to 6 the compressor and expander loops form parts of overall encoders and decoders. The broken connections between encoders and decoders denote that the encoded signals are transferred to the decoders either via a record/playback procedure or via a transmission or signal processing path, referred to generically as an information channel. As explained in the aforementioned specifications, the overall action of an encoder followed by a decoder is to reduce noise introduction in the record/playback procedure or in the transmission or signal processing path. The symbol N is placed in the information channel in FIGS. 1 to 6 to denote that it is here that the noise which is to be reduced is introduced.

In all of FIGS. 1 to 6 a main path 10 extends horizontally through a combining circuit 11 at which there is combined with the signal in the main path the output of a further path 12 (FIGS. 1 and 2) or 13 (FIGS. 3 to 6). In an encoder or a decoder, more than one combining means and further path may be used. Moreover, as will be seen (e.g. from FIG. 27), a further path may include several individual signal paths, operative for example with the same or different time delays and/or in the same or different parts of the frequency spectrum. It is convenient to refer to a further path in the singular whenever only a single further path output signal is created, even though more than one further path input signal may be used.

In FIGS. 1 and 2 the essential characteristic of the further path 12 is that it shall contribute a boosting (compressor action) or bucking (expander action) signal which has a significant effect such as + 10 dB or − 10 dB for low amplitude signals but which is so limited above a low threshold, that with higher amplitude signals, the output of the further path has an insignificant effect, as already explained above. Inverters 14 create the subtractive combination in the case of the expanders. The distinction between Type 1 and Type 2 devices lies in where the further path 12 derives its input:

| Type | Further Path Input derived from |
|---|---|
| Type 1 Compressor | Main path input. |
| Type 1 Expander | Main path output, i.e. output of combining means 11. |
| Type 2 Compressor | Main path output, i.e. output of combining means 11. |
| Type 2 Expander | Main path input. |

The more general terms encoder and decoder have been used above in place of compressor and expander respectively. This is because, for reasons which will become apparent, it is better to utilize the general terms in relation to FIGS. 3 to 6.

In each of FIGS. 3 to 6 encoder configurations appear at (a) and decoder configurations at (b). The further path 13 now has a direct input 15 and a delay input 16. Examples of the further path 13 of varying degrees of complexity will be described below. The further path delays the delay input signal, using one or more delay means. It then forms the difference between the delayed signals and the direct input signals; (one of which will be seen always to be preceded by an inverter 14). This difference is then limited to a low amplitude. The limiting threshold is preferably at an amplitude between 1% and 10% of the maximum peak to peak signal amplitude (i.e. one of two orders of magnitude less than the maximum signal amplitude). While the limiting characteristic can be abrupt or gradual, the output of the limiter should level off with increasing applied signal amplitudes (it can even decrease, if a down-turning limiter circuit is used). The contribution of the further path signal component to the encoder or decoder output signal is preferably less than about one-tenth of the maximum peak to peak amplitude of the main signal component. In this way overshoots, which can cause problems in the recording or transmission channel, are suppressed.

It is desirable so to organize matters that the limiters are operative for the smallest possible proportion of the time, since the noise reduction action of the decoder is diminished or even eliminated whenever limiting occurs. The use of filters, generally high-pass, is helpful in this regard; the use of several different frequency bands for the limiting action is then usually required. It is possible to reduce the number of bands required to achieve a given noise reduction effect by means of automatically variable filters (controlled by signals within the encoder or decoder), instead of fixed filters followed by limiters. The variable filter can be made to effect a narrowing band action with high signal amplitudes. The frequency band passed by the filter is narrowed to exclude high amplitude signal components, thereby limiting or restricting the filter output. As soon as the high amplitude signal ceases, the band-pass of the filter is quickly increased to permit passage of a wider range of frequencies in order to achieve a good noise reduction action. Variable filters with control circuits are possible, but it is convenient in video systems to use a simple, automatically variable circuit known as a filter/limiter (see British patent specification No. 1,120,541). Such a circuit comprises a series impedance (which will usually be either a capacitor or a parallel resonant trap circuit, for dealing with a carrier frequency) and a shunt resistor. The resistor is shunted by oppositely poled limiting diodes. As described in the previously mentioned patent, the diodes conduct and shift the pass band of the circuit upwards (or away from the carrier frequency).

Circuits which either limit in a straightforward way, such as diode limiters, or limit by means of a restricting action involving a variable filter, can be referred to either as signal limiters or as signal restricting circuits.

Each of the eight signal processing circuits of FIGS. 3(a) to 6(b) has both a compressor loop labelled C and an expander loop labelled E; (hence the preference for encoders and decoders as the names for the complete circuits). The loop via the direct input 15 establishes the basic encoding or decoding action whose type is denoted by the first digit of the designations Type 1.1, Type 1.2, Type 2.1 and Type 2.2 applied to FIGS. 3 to 6. This action is cancelled out under precisely repetitive signal conditions by the complementary action of the loop via the delay input, which loop is of the type denoted by the second digit of the aforesaid designations. This cancellation is not effective in respect of signal components which are not the same at intervals equal to the delay to which the delay input signal is subjected.

One way of looking at the effect thereby created is to realize that the opposing actions of the direct and delay inputs create a comb filter with notches at frequencies of $1/t$, $2/t$, $3/t$, etc., where $t$ is the delay. The encoding or decoding action is excluded at the notches. In between the notches, encoding or decoding action of the type denoted by the aforesaid first digit is effective. If the signal being treated includes a carrier or other periodic feature whose period is equal to $t$ or an integral sub-multiple thereof, the periodic feature is excluded from the encoding or decoding action, this being necessary because the periodic feature will otherwise always cause the limiting action of the further path to be operative, and so prevent the encoding and decoding necessary for noise reduction to take place.

If the delay is short compared with the period of the major components of the signal, an alternative way of looking at the situation is more helpful. The major components of the signal are then excluded from the encoding or decoding action since such components do not change appreciably over the delay time $t$. Higher frequency components are however, subject to encoding and decoding whereby noise, which is typically high frequency, introduced between encoding and decoding, is reduced. In terms of the explanation of the preceding paragraph, the said major components occur in the first notch of the comb filter. Components present in the signal with higher frequencies than the said major components will be subject to the higher order notches.

In view of the above-stated preference for Type 2 devices, of the circuits shown in FIG. 3 to 6, the Type 2.2 encoder and decoder of FIG. 6 are generally to be preferred. The operation of Type 2.2 devices will therefore be considered more closely. Since the main path has a completely linear characteristic, this characteristic can be represented by the operator 1. If, in fact, the main path has other than unity gain, a corresponding scaling factor can be applied to the following equations. FIG. 6 has been labelled to show the following signals:

| | |
|---|---|
| x | encoder input |
| y | encoder output and decoder input (i.e. the signal in the information channel) |
| z | decoder output |

For simplicity, only the cases of single delays will be considered. Let the characteristics of the encoder further path via the direct input be $F_1$ and let the characteristics via the delay input be $F_1F_2$ where $F_2$ repesents the action of the delay means. Similarly, let the characteristics of the decoder further path via the direct and delay inputs be $F_3$ and $F_3F_4$ respectively.

From inspection of FIG. 6(a)

$$y = x(1 - F_1F_2) + y(F_1)$$

from which we have:

$$x = y(1 - F_1)/(1 - F_1F_2) \quad (1)$$

From inspection of FIG. 6(b)

$$z = y(1 - F_3) + z(F_3F_4)$$

from which we have:

$$z = y(1 - F_3)/(1 - F_3F_4) \quad (2)$$

Provided now that $F_1 = F_3$ and $F_2 = F_4$ it can be seen that the right hand sides of equations (1) and (2) are identical, whereby $$z = x$$

This demonstrates that, if the further path characteristics of the Type 2.2 decoder are the same as the further path characteristics of the Type 2.2 encoder, the action of the decoder is truly complementary to that of the encoder and the decoded information signal $z$ is exactly the same as the original input signal $x$.

Similar equations can be developed for Type 1.1, 1.2 and 2.1 devices to demonstrate the exact complementarity of each decoder to its encoder.

The foregoing analysis ignores the effect of the decoder on noise introduced in the information channel. To examine this let the gain of the further path be $A$, this same gain applying to signals introduced via either the direct input or the delay input. The gain $A$ is referred to a main path gain of unity and if the main path gain is not actually unity, $A = A_F/A_M$ where $A_F$ and $A_M$ are the actual gains of the further and main paths respectively.

Let the noise voltage at the input to the decoder be $n_I$ and at the output from the decoder be $n_O$. Furthermore, let the noise voltage at the output from the decoder at time $t$ (the delay time) prior to current time be $n_D$.

Again considering the Type 2.2 decoder (FIG. 6(b)), we have $$n_O^2 = n_I^2(1 - A)^2 + n_D^2 A^2 \quad (3)$$

In a practical system it can be assumed that the correlation of the recirculating component of noise in the C loop of FIG. 6(b) can be ignored, since appreciable components of recirculating, correlated noise lead to undesirable visual effects. Accordingly, it is appropriate to consider the combination of RMS values. Assuming random white noise we can put $n_D^2 = n_O^2$ from which equation (3) simplifies to:

$$n_O^2(1 - A^2) = n_I^2(1 - A)^2$$

Therefore $$n_O^2/n_I^2 = (1 - A)/(1 + A)$$

and $$n_O/n_I = \sqrt{(1 - A)/(1 + A)} \quad \text{Type 2.2}$$

If $A$ is the aforementioned value 0.684, the ratio of $n_O$ to $n_I$ is 0.43.

A similar working can be developed for the type 1.1 decoder. In this case $$n_O^2(1 + A)^2 = n_I^2 + A^2 n_{DI}^2 \quad (4)$$

where $n_{DI}$ represents input noise at time $t$ prior to current time. Assuming random white noise, $n_{DI}^2 = n_I^2$ and equation (4) simplifies to $$n_O/n_I = \sqrt{(1 + A^2)/(1 + A)} \quad \text{Type 1.1}$$

This expression is at a minimum when $A = 1$, giving $n_O/n_I = 1/\sqrt{2}$, i.e. 3 dB noise reduction.

The derivation of the other expressions will not be given but the results are:

$$n_O/n_I = 1/\sqrt{(1 + 2A)} \quad \text{Type 1.2}$$

$$n_O/n_I = \sqrt{1 - 2A + 2A^2} \quad \text{Type 2.1}$$

which is a minimum, again $1/\sqrt{2}$, when $A = \frac{1}{2}$.

FIG. 7 shows a Type 2.2 circuit switchable between the encoding mode with switches 17 and 18 positioned as shown at setting R and the decoding mode with the switches both changed over to setting P. The settings are labelled R and P since the encoding and decoding modes are typically used for recording and playback respectively. Similar schemes are applicable to FIGS. 3 to 5.

FIGS. 8 and 9 are block diagrams of an encoder and decoder, respectively, of Type 2.2 with a simple form of further path 13 shown in more detail. In FIG. 8, the encoder, the output signal is fed back via the direct input 15 to a combining means 19. The input signal is fed forward via an inverter 14 and the delay input 16 to delay means 20, where it is delayed for the required period, e.g. that of one or a plurality of television lines or fields. The delayed signal is fed into the combining means 19 via an amplifier 21 and gain control 22. The gain of the delayed path is set by the control 22 to precisely that of the direct input path 15 so that the information recurring periodically at a rate which is the reciprocal of the delay time of 20 is removed by the delayed path from the direct path 15 in the combining means 19.

The output of the combining means 19 is fed through a filter/limiter 23 (or alternatively through a plurality of filter-limiter paths as shown in FIGS. 25 and 26), then through an amplifier 25 and a noise reduction gain control 26. The further signal component is added to the component contributed by the main path 10 in the combining means 11.

The decoder shown in FIG. 9 restores the original signal, since the further path 13 is identical to that of FIG. 8, the direct and delayed inputs merely being transposed in the circuit in accordance with FIG. 6(b) and the above analysis demonstrating $z = x$ applying.

Since the path via the delay input 16 forms a positive feedback circuit in FIG. 9 of less than unity gain, the non-periodic part of the delayed signal is recirculated as a decaying infinite series.

Thus, in both encoder circuits only those signal components not recurring at the rate of the reciprocal of the delay time undergo any waveform processing. Noise reduction, however, occurs at all times when there are no larger changes in the image, either in the X-dimension (short delays), Y-dimension (line delays), or time-dimension (field and picture delays). The limiters 23 will only limit when there are large changes along a line in the short delay case or line-to-line changes in the line delay case or where there is movement in a picture, or other picture change in the frame or field delay case. Such limiting will not visibly worsen the noise reduction performance, as large transitions, whether occurring spatially or temporally, will mask the noise present during the time the filter/limiters in the expander circuit are choked and unable to yield any significant outputs to effect noise reduction.

FIG. 10 shows a modified version of the encoder of FIG. 8 in which the single filter/limiter 23 is replaced by a filter 27 in the direct input path, another filter 28, not necessarily identical, in the delay input path, and a limiter 24 following the combining means 19. This lack of identity between filters may be necessary if the bandwidth of the delay means 20 is restricted. FIG. 11 is the complementary decoder for use with the encoder of FIG. 10.

The circuits of FIG. 10 and 11 may be used in particular with line delays 20 to provide noise reduction over a band typically of 5 kHz to 200 kHz of a television signal. This range cannot be effectively covered by a simple noise reduction system as shown in FIGS. 1 or 2 due to the presence of high amplitude signals at line frequency and low order multiples. In this application the filters 27 and 28 are of the low pass type with a typical cut-off frequency of, say, 350 kHz. The low frequency luminance component of the delayed path signal is subtracted from that of direct path in the combining means 19 as previously described. The limiter 24 is an instantaneous diode limiter and ideally has a down-turning output characteristic. Alternatively, a filter/limiter 23 (as in FIGS. 8 and 9) can be used in place of the limiter 24, in which case the frequency characteristics of the further path will be determined by the combined actions of the filters 27 and 28 and the filter/limiter 23.

Figure 12B:
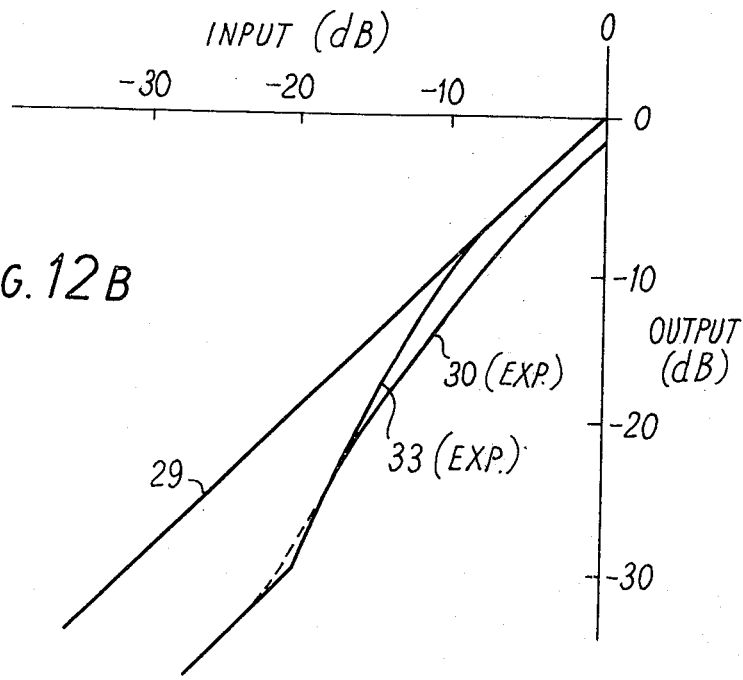

By a down-turning characteristic is meant a characteristic which limits above a low threshold and limits even more strongly as the signal level rises to a high level. FIG. 12A shows the input output characteristics of the circuit of FIG. 10 on a dB plot. Line 29 represents a linear characteristic which applies to the main path 10 and also to the complete circuit at the frequencies excluded from the encoding action by the cancelling effect of the direct and delay paths. Curve 30 represents the compressed characteristic created by the encoding action at the non-excluded frequencies with a knee 30A created by the threshold of a diode limiter. Line 31 shows the noise reduction component of the signal (further path output) assuming a sharp limiting characteristic. In practice a more gradual characteristic 31A is obtained (and is in fact generally more desirable) and smooths the knee 30A to the curve 30B. It will be noted that there is a significant encoding overshoot or offset 32 with large signal variations, of the order of 1 dB which is unavoidable with the use of a simple diode limiter. The desired characteristic is illustrated at curve 33 and can be obtained if the characteristic 31 or 31A is changed to a down-turning characteristic 31B or 31C by means of the circuit of FIG. 13, which shows simply the limiter 24 of FIGS. 10 and 11, or the filter/limiter 23 of FIGS. 8 and 9, in detail. The expanded characteristic for the decoding action is complementary to the compressed characteristic and is shown in FIG. 12B. The circuit of FIG. 13 produces corresponding actions in both encoders and decoders.

Figure 13:
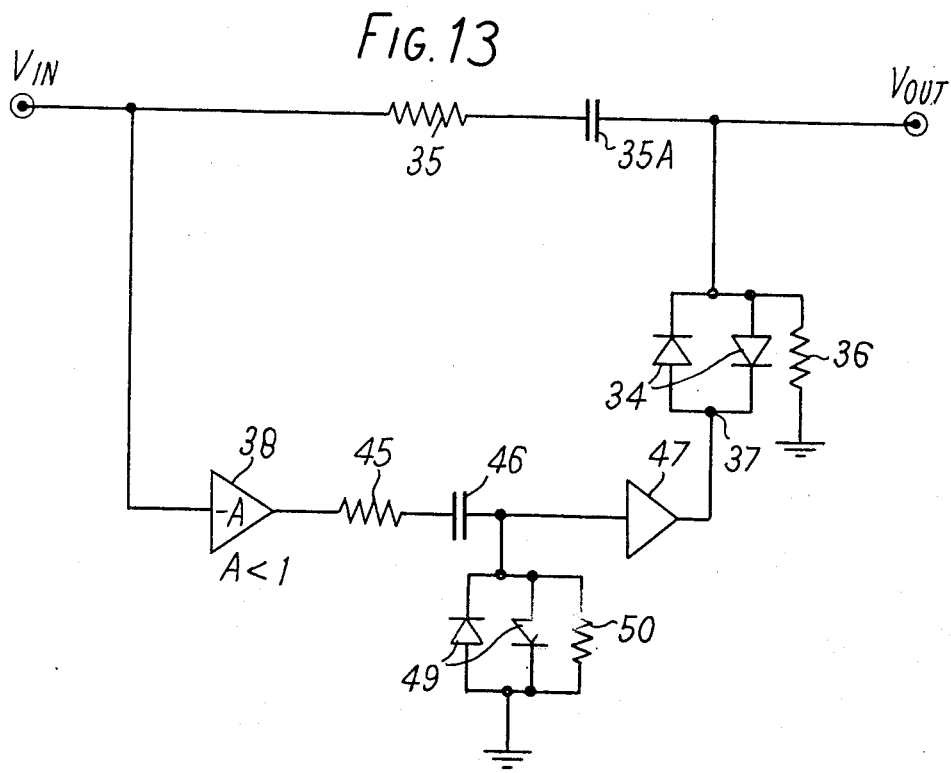

The limiter of FIG. 13 consists of two back-to-back diodes 34 working into a resistor 35 and provided with a bleed path to ground through resistors 36. For variable band operation, the resistor 35 is made small enough not to have any appreciable effect on the changing of the capacitor 35A and this capacitor 35A, together with resistor 36 and the diodes 34, forms the variable filter. If point 37 were merely returned to a fixed bias of 0v, the diodes would limit at a peak-to-peak input level of, say, 1.2v. However, the point 37 is provided with a variable bias via an inverting amplifier 38 with gain A less than unity and the point 37 is therefore pulled instantaneously in the direction tending to reduce the limiting level.

Figure 14:
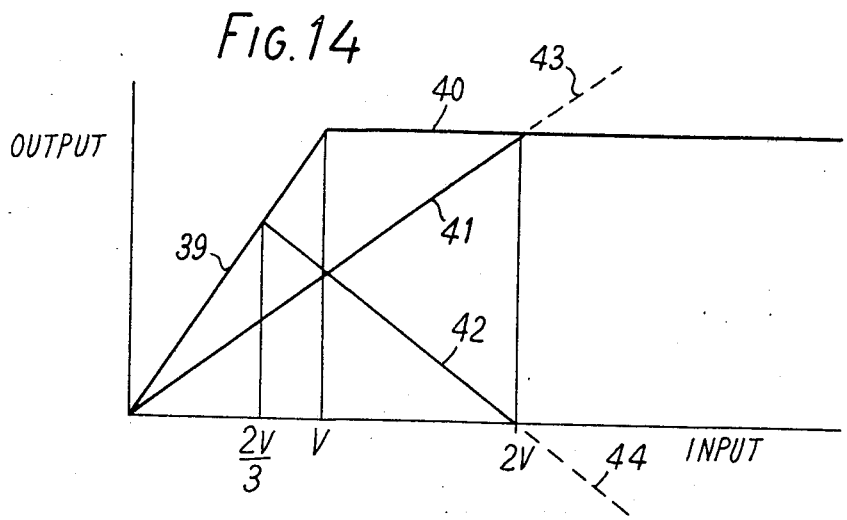

This action can be explained by referring to FIG. 14 which shows the input-output characteristic 39, 40 for the positive limiting diode 34, referenced 0v. Line 41 represents the magnitude of the bias voltage provided by amplifier 38, this line having a smaller slope than the non-limited part 39 of the characteristic 39, 40 since the gain of the amplifier is less than unity, e.g. a gain of ½. Since amplifier 38 is inverting, characteristic 41 is effectively subtracted from characteristic 39, 40 to arrive at down-turning characteristic 39, 42. If the output of amplifier 38 increased indefinitely as shown at 43 the characteristic would fall below zero as at 44, (effectively turning compressor action into expander action, or vice versa). This is prevented by feeding the output of the amplifier 38 to the point 37 through a resistor 45, coupling capacitor 46 and buffer amplifier 47, and by limiting the signal at the input to the buffer amplifier to the same level 40 by means of diodes 49 and bleed resistor 50. If the gain A is ½ it can be seen that, if diodes 34 limit at input level V, diodes 49 will limit at input level 2V.

The lower circuit of FIG. 13 preferably has the same limiting or filtering/limiting characteristics as the upper circuit. It will be appreciated that, until the diodes 34 start to conduct, the lower circuit is completely without any action on the upper circuit.

The described cancellation action between the compressor and expander loops of FIGS. 3 to 6 is dependent upon the correct gain being established for the delay input path relative to the direct path, and upon the correct delay time being established.

Although it will in some instances be practicable to build circuits with adequate longterm gain and phase stability, in other instances it may be desirable to provide automatic, closed loop control of gain and/or phase. FIG. 15 illustrates how this may be achieved in a generalised form os the encoder of FIG. 10. The same measures are obviously also applicable to the decoder of FIG. 11.

The video signals applied to the combining means 19 are rectified and smoothed in circuits 51 and 52 respectively. The rectified signals are smoothed with an integration time constant which is long compared to one television line, and the integrator outputs are compared in a differential amplifier 53. The differential amplifier output voltage on line 54 controls a voltage controlled resistance which constitutes part of the gain control 22 and is included in a high-gain feedback system, ensuring a very small amplitude error of the delayed signal at the combining means 19.

To effect corresponding phase control the signals at the two inputs to the combining circuit 19 are applied to a phase comparator 53A whose output controls a fine delay in the control 22.

FIG. 16 and FIG. 17 are block diagrams of an encoder and complementary decoder suitable for processing NTSC or PAL encoded chrominance signals in colour television systems.

Bandpass tuned circuits 55 and 56 are centred on the colour subcarrier frequency. Delay 20 is typically of one (or two) television lines for NTSC encoded signals, and of two lines for PAL encoded signals. The delayed chrominance signal is subtracted from the direct signal in the combining means 19 after either manual or automatic gain and phase adjustment in a circuit 57.

The phase must be adjusted so as to compensate for the line-to-line phase difference (half cycle or quarter cycle) in the subcarriers of the NTSC and PAL systems, respectively. Similarly, half or quarter cycle compensation must be made in the case of field and picture delays.

In the line delay case, the delay means has a one-line or two-line delay for a simple NTSC signal or a two-line delay for a PAL signal. The subcarrier frequency is cancelled out in the combining means 19, whereby this component does not choke the encoding or decoding action. The delay means 20 and combining means 19 effectively create notches every 7.8 kHz, centred on the subcarrier frequency and inner side bands thereof.

Components of the luminance signal in the subcarrier region, having a frequency spectrum interleaved with that of the chrominance signal, will not normally subtract in the combining means 19, and will be subjected to encoder action in the case of FIG. 16 and decoder action in the case of FIG. 17.

In order to be able to treat different parts of the frequency spectrum separately, different encoders and decoders may be arranged to operate in parallel and/or in tandem (series). FIG. 18 illustrates the principle of one tandem arrangement in which, on the encoding side, a Type 2.2 encoder 58 is followed by a Type 2 compressor 59 while, on the decoding side, a Type 2.2 decoder 60 is preceded by a Type 2 expander 61.

It will be appreciated that the further paths of FIG. 18, and also of FIG. 19, will contain filters defining the frequency bands within which each constituent circuit is operative.

In FIG. 19 the use of Type 1.2 devices allows a single combining means or mixer 62 to serve all further paths. On the encoding side two Type 1.2 encoders 63 and 64 operate in parallel and are followed by a Type 2 compressor 65. The encoders 63 and 64 have different delay times and/or different filters in their further paths. On the decoding side a Type 2 expander 66 is followed by two parallel-acting Type 1.2 decoders 67 and 68.

Figure 20:
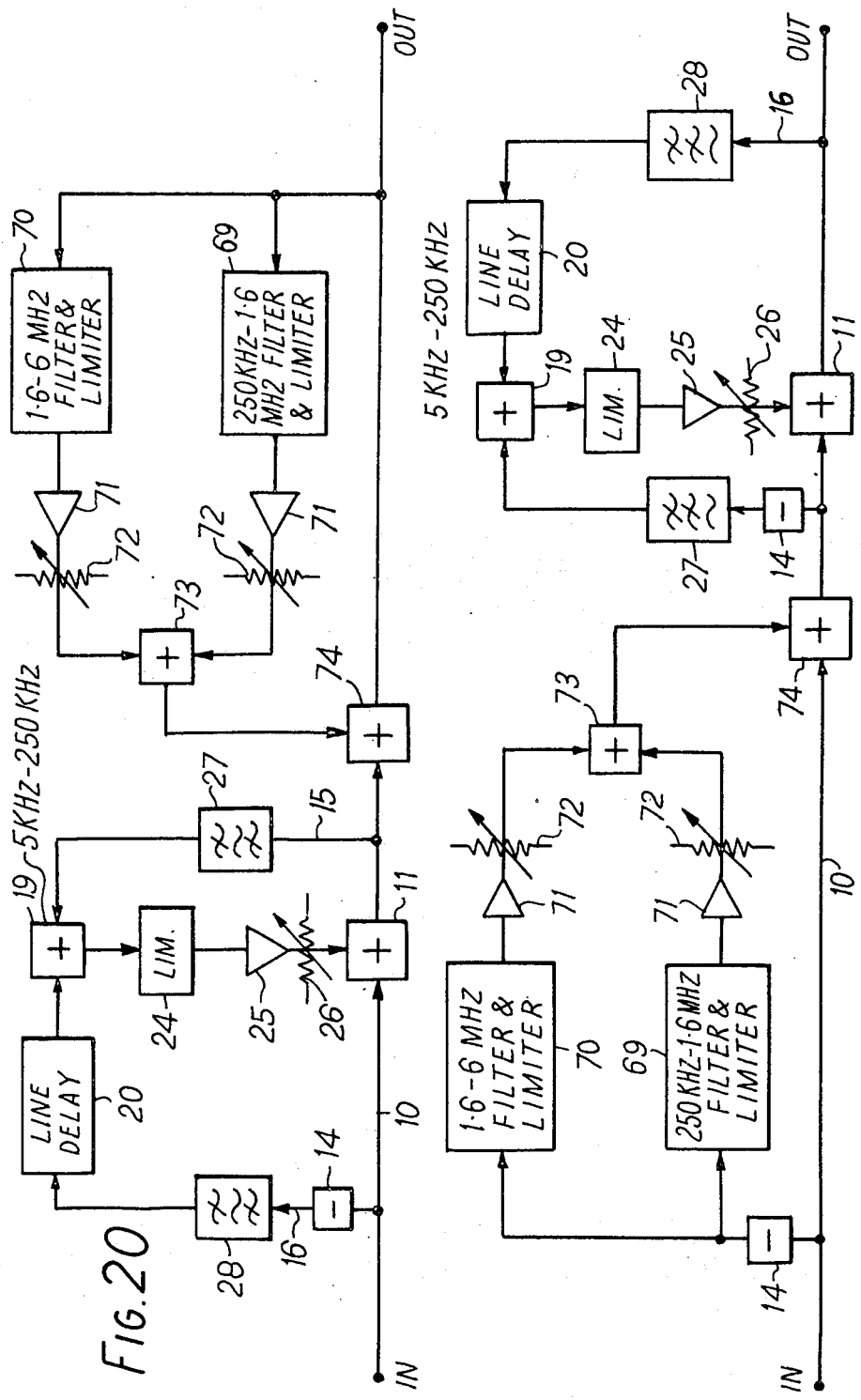

FIG. 20 is a block diagram of a suitable wideband noise reduction system for monochrome television, capable of providing noise reduction from 5 kHz to at least 6 MHz and representing a specific example of FIG. 18. The upper part of FIG. 20 shows the encoding circuit whose output feeds a signal to the input of the decoding circuit, shown in the lower half of the figure, by way of a transmission path or a storage means such as a video tape recorder. The lefthand part of the encoding circuit will be recognised as the circuit of FIG. 10, as specifically described for treating a television signal, and the limiter 24 together with the filters 27 and 28, cause this circuit to be operative in the frequency band from 5 kHz to 250 kHz, the low frequency cut-off of 5 kHz arising because of the first notch of the comb filter, which is centred on zero frequency. This frequency band is the lower frequency portion of the video signal, which includes the 15 kHz line frequency and lower harmonics thereof. These are eliminated by the delay 20 having a delay of one or more lines and the combining means 19. The righthand portion of the encoding circuit consists of a compressor of the Type 2 configuration disclosed in British patent specification No. 1,253,031, with two further paths. These paths include filters and limiting means 69 and 70, respectively, handling the bands from 250 kHz to 1.6 MHz and from 1.6 MHz to 6 MHz. The outputs from the two limiting filters are fed to amplifiers 71 and thence, by way of gain adjustment devices 72, to a combining circuit 73 whose output is added to the main path component by a combining circuit 74. These two further paths are thus analogous to the further paths of FIG. 1 of British specification No. 1,120,541, although they are (as noted above) connected in the Type 2 configuration of specification No. 1,253,031 and accordingly have gains less than unity, e.g. 0.684. These two further paths effectively provide two compressors in tandem with the encoder which handles the 5 kHz to 250 kHz band. Since the two further compressors handle substantially higher frequencies, they are not influenced adversely by the line frequency or its significant harmonics, and therefore it is not necessary to incorporate means for cancelling out this frequency or its harmonics.

The decoding circuit is completely complementary to the encoding circuit. The lefthand part of the decoding circuit incorporates the two further paths 69 and 70 dealing with the two high frequency bands preceded by an inverter 14 and feeding a signal to the combining means 74 which subtracts the output from the adding means 73 from the main component in the main path 10. The output of the combining means 74 is fed to the low frequency decoder circuit constituted in accordance with FIG. 11 of the drawings.

Figure 21:
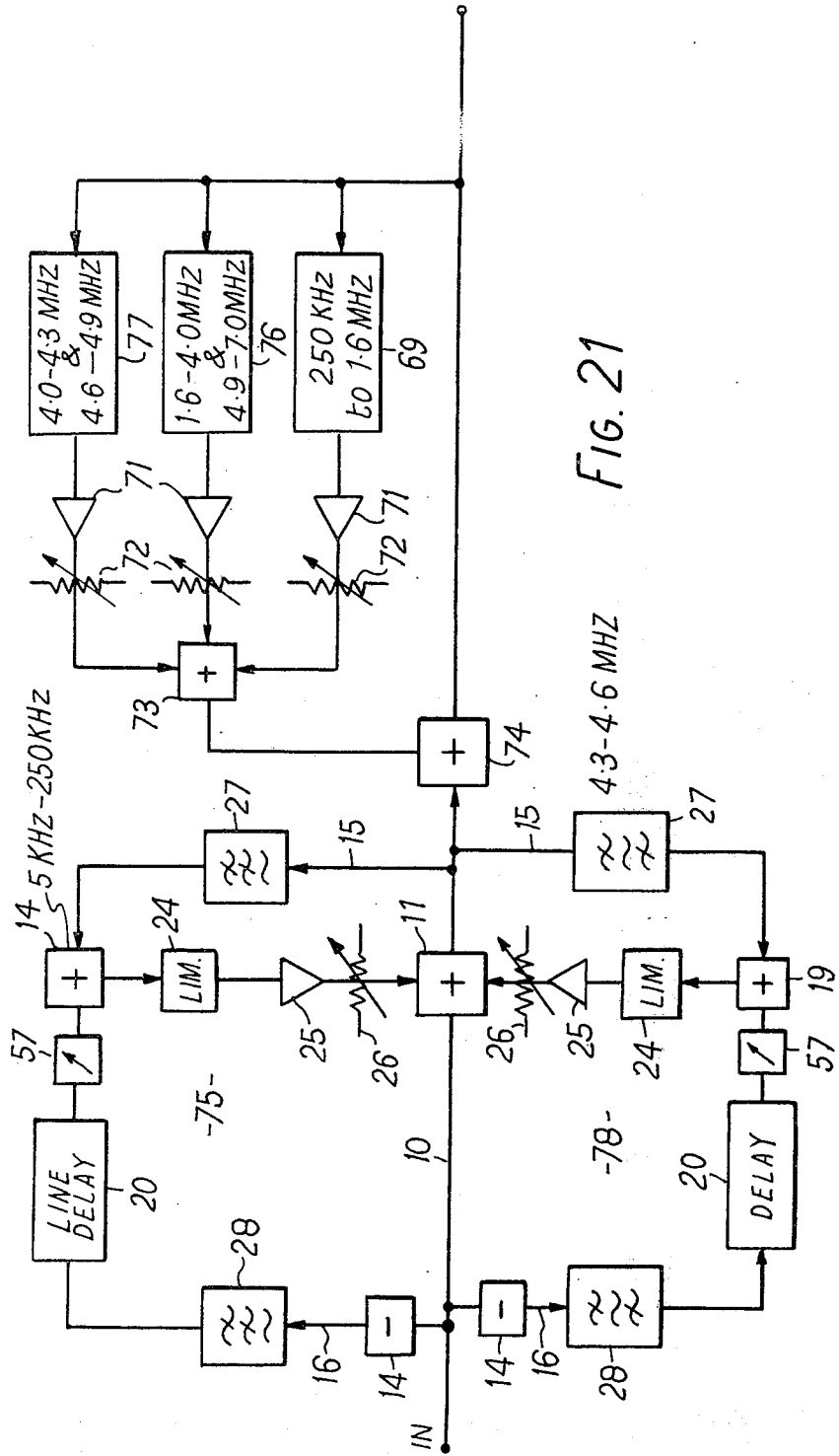

FIG. 21 is the block diagram of an encoding circuit suitable for colour television systems, and again represents a specific example of FIG. 18. In this case, the circuit is shown with five further paths, two being of a delay line type, one to operate at frequencies in the line frequency region and the other at frequencies in the colour subcarrier region. A sixth further path with field delay means can be added to deal with fields, pictures and multiple periods thereof.

Figure 22:
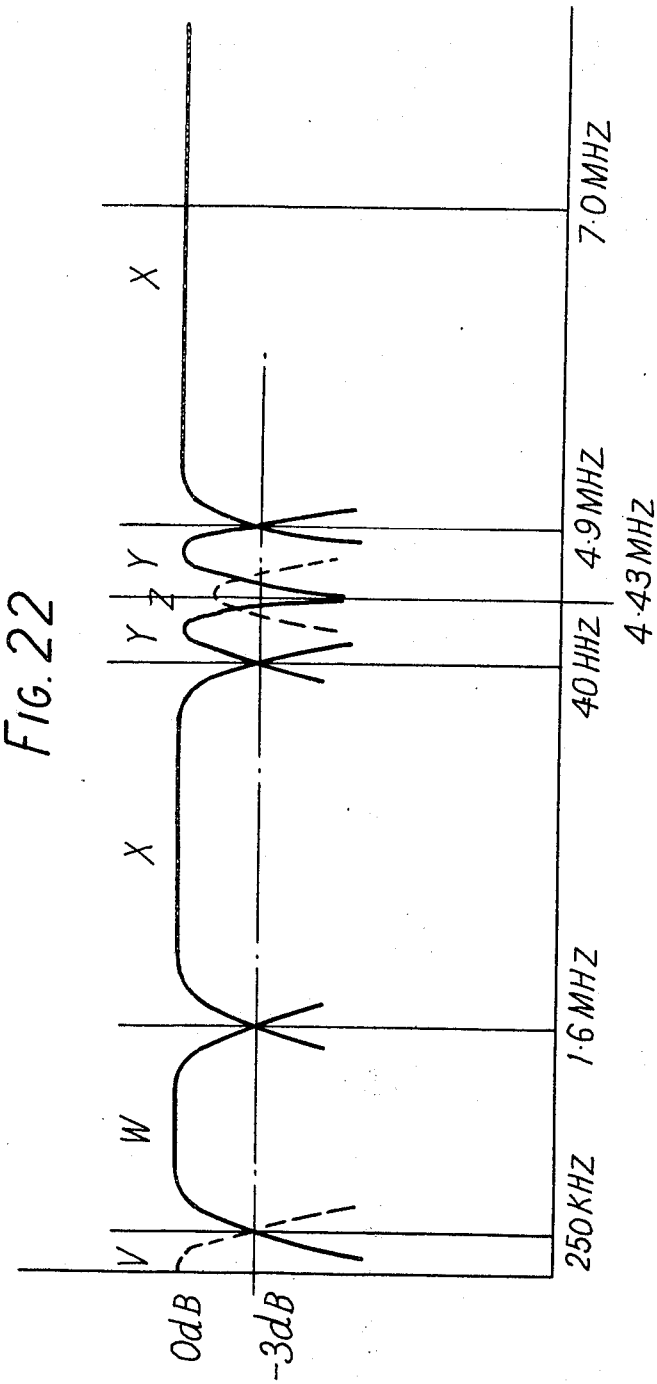
FIG. 22 shows frequency bands applicable to FIG. 21.

FIG. 22 shows the five frequency bands V to Z to be handled by the five further paths. The band V from 5 kHz to 250 kHz is treated by the encoder 75 including a delay 20 with a delay of one or more lines. The band W from 250 kHz to 1.6 MHz is handled by a Type 2 compressor based upon the filter and limiter 69. The band X extends from 1.6 MHz upwardly with a broad notch from 4.0 MHz to 4.9 MHz and is treated by a second Type 2 compressor based upon a filter and limiter 76. The band Y extends from 4.0 MHz to 4.9 MHz with a sharp notch centred on the colour subcarrier frequency, here assumed to be 4.43 MHz, as is appropriate for European PAL standards. The band Y is treated by a third Type 2 compressor based upon a filter and limiter 77. If the abovementioned sixth band, say band U, were to be added, it would deal with frequencies from a fraction of a Hertz up to the region of low hundreds of Hertz.

The way in which the bands W, X and Y are created is preferably as described in the specification of copending application No. 346,629 filed Mar. 30, 1973, now abandoned in the name of Paul A. Spencer.

Finally the narrow band Z centred on 4.43 MHz is treated by an encoding circuit 78 of the same form as FIG. 16 with filters 27 and 28 passing only the band 4.3 to 4.6 MHz.

The decoding circuit complementary to FIG. 21 will be readily apparent by analogy with the foregoing drawings.

In some applications, the encoder 75 may be omitted since noise reduction is not essential in the 5 kHz to 250 kHz band and furthermore, the use of an extremely high quality delay line 20 is necessary in this band. Otherwise, the delay 20 creates spurious signal components outweighing the advantages of noise reduction.

So far, details have been given of circuits using line delays only but, as mentioned previously, the delay 20 in FIGS. 8 and 9 could alternatively be a field delay, even although at present field delays having the required degree of stability are expensive. The field delay may be a digital delay or a magnetic delay, for example. The encoder 63 and decoder 67 of FIG. 19 could utilize a line delay while the encoder 64 and decoder 68 utilize a field delay. Such a system is of advantage in that the different delays enable different kinds of noise to be treated. A field delay system will provide noise reduction in the time domain, i.e. reduce noise which varies from field to field. This will cater for much noise but not for stationary moiré or other patterns such as horizontal barring arising from a multi-head video tape recorder of which one head is not perfectly balanced with the other heads. On the other hand, such defects, but not vertical striations, will be treated by a line delay system which operates in the y-axis (vertical) domain by comparing line to line. Vertical striations will be better handled by the ordinary compressor/expander paths without delay (e.g. 65 and 66 in FIG. 19) which operate in the x-axis (horizontal) domain.

It should be pointed out here that the television noise reduction systems discussed herein find particular utility when the information channel is a video recorder, enabling the noise introduced in the record/replay procedure to be reduced. Another important application is when the information channel is a standards converter, as discussed below. It is also possible to precede a television link by an encoder and follow the link by a decoder to reduce noise introduced in the link (information channel). Finally an encoded signal can be broadcast to receivers which embody decoders.

In disc video recording and/or reproducing systems, whether by optical, mechanical (e.g. groove), or other storage means, it is particularly convenient to derive field or picture delays by means of a multiplicity of pickup devices which scan adjacent tracks on the storage means.

Because of the different line offsets appearing from field to field and subcarrier offsets appearing from line to line, it may be difficult to handle an NTSC or PAL signal satisfactorily in encoded form if field delays are used. It is, in any case, not easy to split the encoded signal into different frequency bands; there is no difficulty however if the baseband signals are used, and accordingly the scheme illustrated in FIG. 23 may be employed. On the encoding side the incoming signal is decoded by a colour decoder 78 into, say, the Y, U and V signals for a PAL signal, or the Y, I and Q signals for an NTSC signal. Alternatively, decoding may be to the R, G and B signals. The three signal components are in any event encoded (in the sense of the present invention) by noise reduction encoders 79, 80 and 81 and then recombined by a colour encoder 82.

On the decoding side a colour decoder 83 is followed by noise reduction decoders 84, 85 and 86, followed in turn by a colour coder 87. The noise reduction encoders and decoders are of the forms previously described employing line delays and/or field delays with the optional addition of compressors and expanders without delays.

Figures 23, 24:
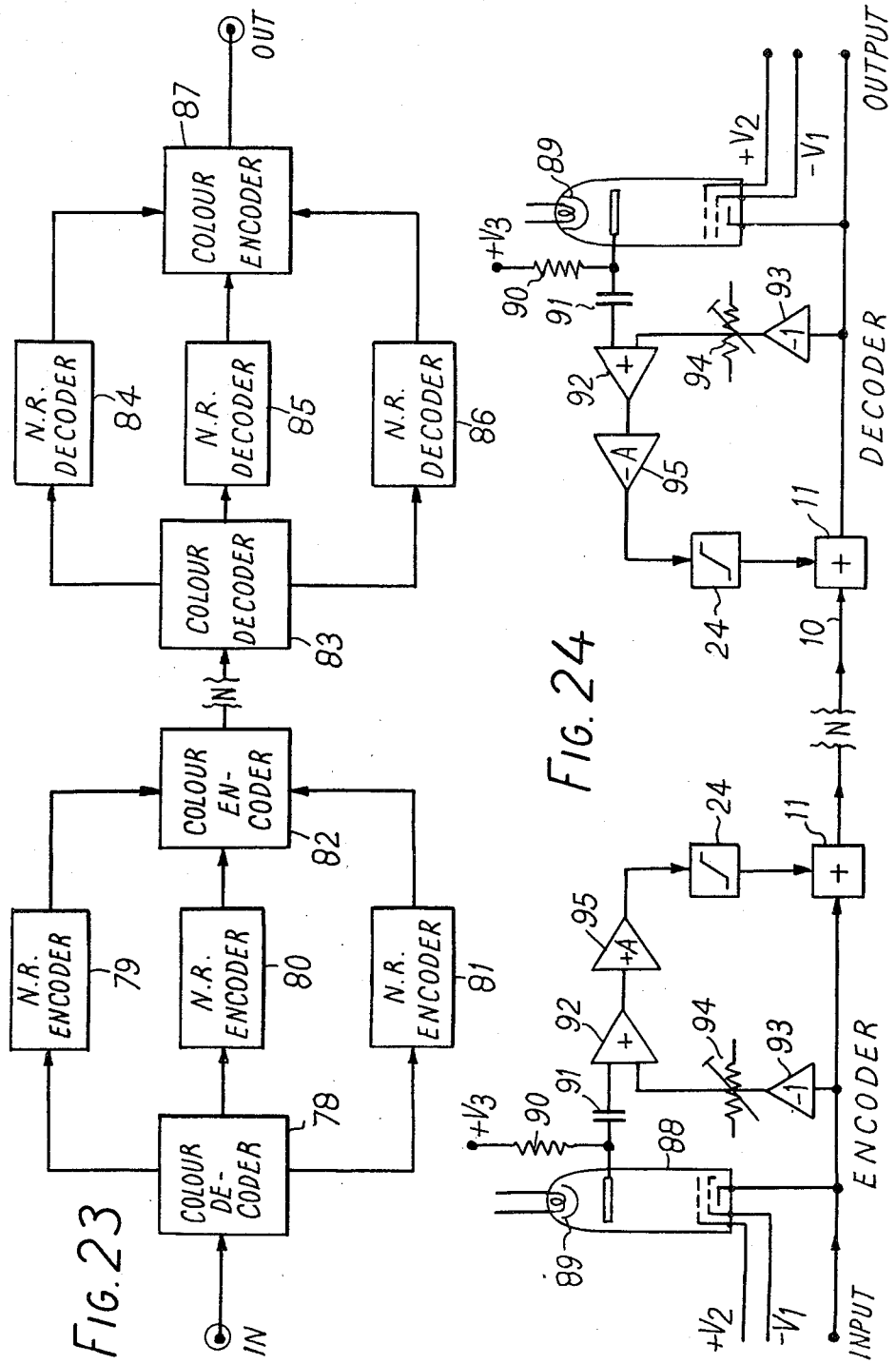
FIG. 23 shows a system operable with decoded colour signals such as Y, U and V signals.
FIG. 24 shows a simple field delay encoder and decoder.

FIG. 24 shows a simple form of encoder and decoder for use with a field or picture delay. A vidicon 88 has its screen uniformly illuminated by a lamp 89 so that charge leaks from its screen at a uniform rate via a resistor 90. In the case of the encoder, the scanning beam of the vidicon is modulated with the incoming signal and therefore writes the incoming signal over the signal as recorded in the previous field or picture, subject to the decay occasioned by the charge leakage. The signal coupled out through capacitor 91 therefore represents the difference between the incoming signal and the signal one field or picture back plus a component created by the leakage. This latter component is cancelled out by applying to a mixer 92 the signal coupled out through the capacitor 91 and a signal derived from the output of the main path by an inverting amplifier 93 and a gain setting control 94. Only the difference signal appears at the output of the mixer 92 and this signal is applied through an amplifier 95 to the limiter 24 whose output feeds the combining means 11. The vidicon therefore establishes the delay and also forms the difference signal. The gain factor A of the amplifier 95 establishes the further path gain.

The action on the decoding side is essentially the same but the beam of the vidicon is modulated by the output of the combining means 11 and the amplifier 95 is now inverting to cause the limited difference signal to subtract from the main path signal in the combining means 11. The circuits of FIG. 24 will be recognized as an example of the Type 1.2 configuration and the gain factor A is the factor which applies in the noise reduction equation given above for this configuration. The circuits of FIG. 24 can be re-arranged in accordance with FIG. 5 so as to be of Type 2.1 configuration.

In most embodiments of the invention it is preferable to utilize a plurality of signals delayed by $t$, $2t$, etc. to $Nt$ (where $t$ is the repetition and delay period and N is an integer greater than 1). In this way the direct signal interacts with the average history of the signal over the preceding N fields, lines, or whatever is the relevant repetition period.

This principle, referred to previously, is specifically illustrated in FIG. 25, with reference to a Type 2.1 decoder by way of one example. There are now N delay lines 20 - 1 to 20 - N in parallel with delays equal to say one line, two lines, three lines, etc. or one field, two fields, three fields, etc. The delay input 16 and the direct input 15 are connected as in FIG. 5(b). The output of each delay line is combined in a corresponding combining circuit 96 with the direct input signal, inverted by the inverter 14. The output from each combining circuit 96 is applied to a pair of filter/limiters 97 and 98 whose outputs are combined by a circuit 99. The outputs of all circuits 99 are combined in a circuit 100 whose output is applied to the combining means 11 in the main path.

A pair of filter/limiters 97, 98 is used for each sub-path of the further path to deal with lower and higher frequency bands respectively, in order that noise reduction may continue in one band when it is blocked in the other band by high amplitude components in the latter band. For example, brightness changes or picture movement may block noise reduction in the low frequency band but allow noise reduction still to take place in the high frequency band.

In the general case of FIG. 25, the further path effectively comprises N sub-paths, each of which is split in turn into two (or more if required) sub-sub-paths. The gains of the N sub-paths do not all have to be the same but, assuming that they are, for optimum noise reduction the signal from each combining circuit 99 should be 1/N times that required from the single delay line 20 in FIG. 9.

It is somewhat wasteful to use delay lines in parallel and the series arrangement of FIG. 26 is preferred. This differs from FIG. 25 only in that the delay lines 20 - 1 etc. are all of the same delay $t$ and are in series so that the cummulative delays at their outputs are $t$, $2t$, $3t$, and so on.

The further paths of FIGS. 25 and 26 may be employed in any other of the encoder or decoder configurations of FIGS. 3 to 6.

Figure 27:
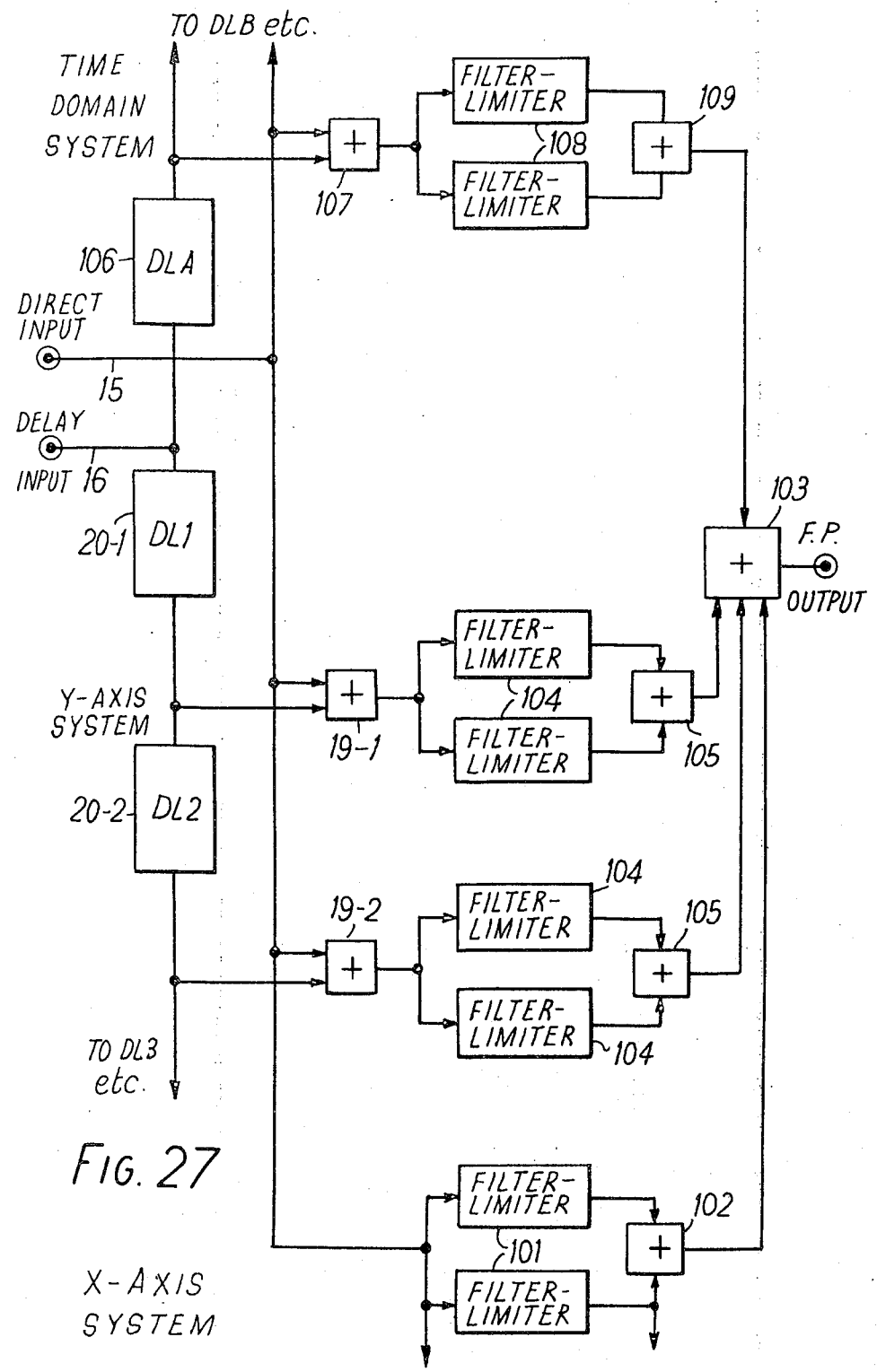
FIG. 27 illustrates a further path using multiple delays in series.

FIG. 27 shows a more developed version of the further path only of FIG. 26, useable for an encoder or decoder as in FIG. 23 for example, or more generally in any of FIGS. 3 to 6. This path is intended to operate in the time, Y-axis and X-axis domains. In the X-axis domain two or more filter/limiters 101, corresponding for example to blocks 69 and 70 of FIG. 20, will provide ordinary Type 2 compressor or expander action if the circuit is connected in the encoder and decoder of FIG. 6. The filter/limiter outputs are added at 102 and fed to an output combining circuit 103 whose output will be applied to the combining circuit 11 in the main path. In every case, two filter/limiters are provided for lower and higher frequency bands, for the reasons given in relation to FIG. 25.

In the Y-axis domain, series connected delay lines 20 - 1, 20 - 2, etc., each having a one line delay, feed delayed signals to combining means 19 - 1, 19 - 2, etc. The output of each such combining means is applied to a pair of filter/limiters 104, whose outputs, combined by circuits 105, are applied to the circuit 103.

The time domain system is similar to the Y-axis system except that the delay lines will provide field delays. Only the first delay line 106 is shown with its combining circuit 107, pair of filter/limiters 108, and combining circuit 109.

In describing FIGS. 25 to 27 it has been assumed that combined filter/limiters have been used. It is equally possible to separate the filtering and limiting functions, e.g. as in FIGS. 10, 11, 15, 16 and 17.

The invention may be employed, as already mentioned, to reduce noise introduced by a standards converter, in which case an encoder preceding the converter will have delay times and other parameters appropriate to the standard of the input signal while a decoder following the converter will have delay times and other parameters appropriate to the standard of the output signal.

Figure 28:
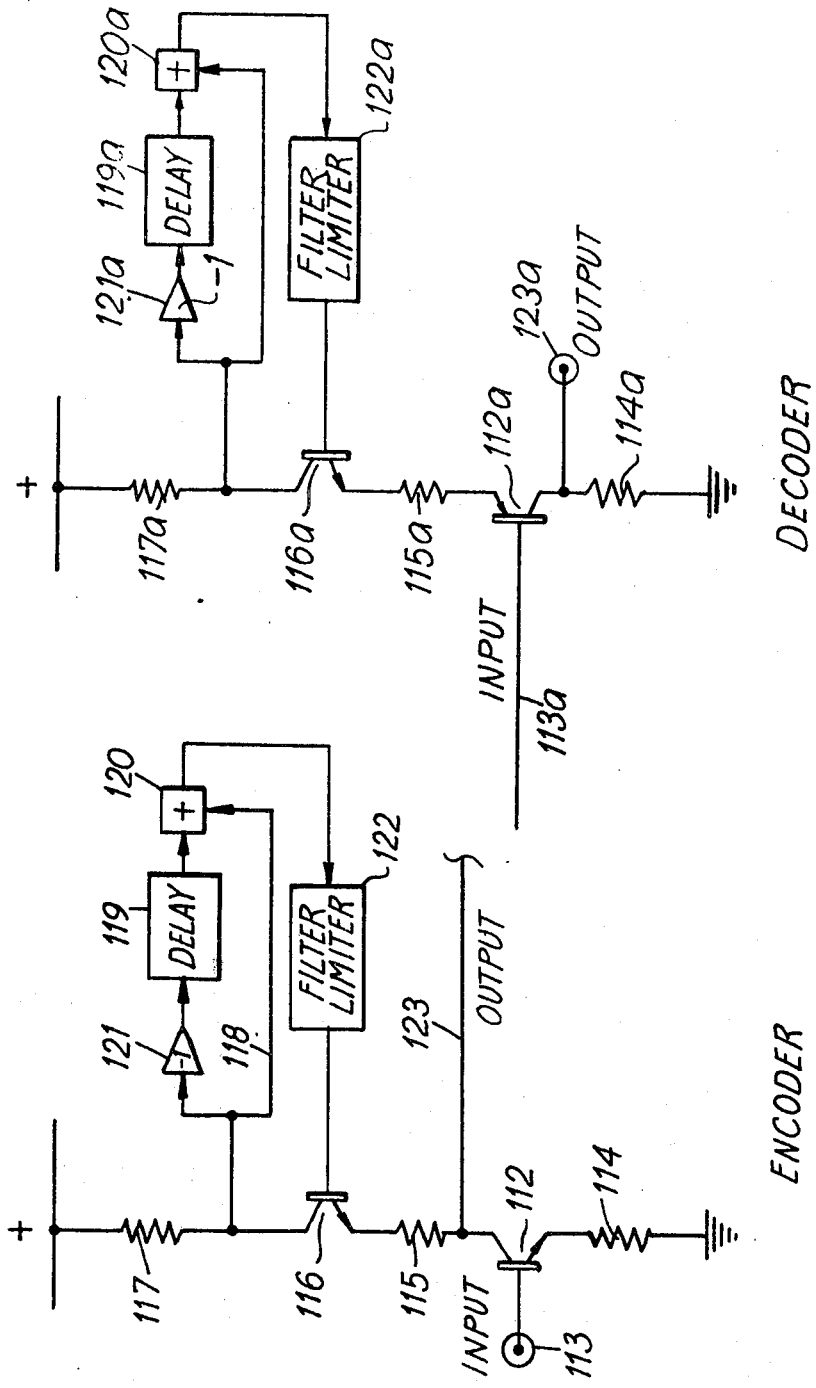
FIG. 28 shows a further encoder and decoder embodying the invention and in which operate in a series combination mode rather than a parallel combination mode.

Turning now to FIG. 28, it is not necessary to feed the main or dynamically unmodified signal component and the difference signal component in parallel to a combining means. The necessary signal derivations and combining actions can take place in a series mode. Considering the encoder of FIG. 28, the main signal component is derived by input transistor 112 serving as a current source controlled by the input signal applied to the base of the transistor at terminal 113; the main signal component is the linear signal dropped across the collector load formed by resistor 115. Transistor 116 serves as the means for combining the difference signal component with the main signal component. Resistor 117 serves as a current to voltage converter, whereby the input signal may effectively be transferred to the further circuit, the output of which is the difference signal component and is fed to the combining transistor 116. The further circuit includes a direct path 118, a delay path 119, adding means 120 for adding the components from these paths, thereby to form a difference signal by virtue of an inverter 121 in the delay path, and a filter-limiter 122 operative to restrict the difference signal in the manner already noted.

The output of the filter-limiter 122 is applied to the base of the transistor 116 which acts as the combining means in the main circuit. The encoder output is taken from the collector of transistor 112 at line 123 and the output voltage level is determined by the current driven by transistor 112 through resistors 115 and 117 and transistor 116. Transistor 112 is an NPN transistor whose current increases as input signal voltage increases. An inverted output is accordingly obtained at output line 123. This output includes a main component developed across resistor 117 and a component developed across transistor 116. When the difference signal increases, it does no negatively, as it is, like the output signal, an inverted signal and it, therefore, reduces the conductivity of the NPN transistor 116. This increases the component developed across this transistor and this component accordingly boosts the main component, thereby to provide the encoding, compressing action.

In the decoder, the various components have been given the same references as in the encoder but with an added *a*. The only differences are that the transistor 112*a* is a PNP transistor with collector and emitter reversed relative to the transistor 112 while the output 123*a* is relocated so as again to be connected to the collector. Transistor 112*a* therefore has a fixed collector load 114*a* and the components 115*a*, 116*a* and 117*a* now constitute a variable emitter load providing variable negative feedback. When the difference signal reduces the conductivity of transistor 116*a*, the amount of negative feedback increases whereby the output voltage level decreases in magnitude, thereby to provide the decoding, expander action.

Figure 29:
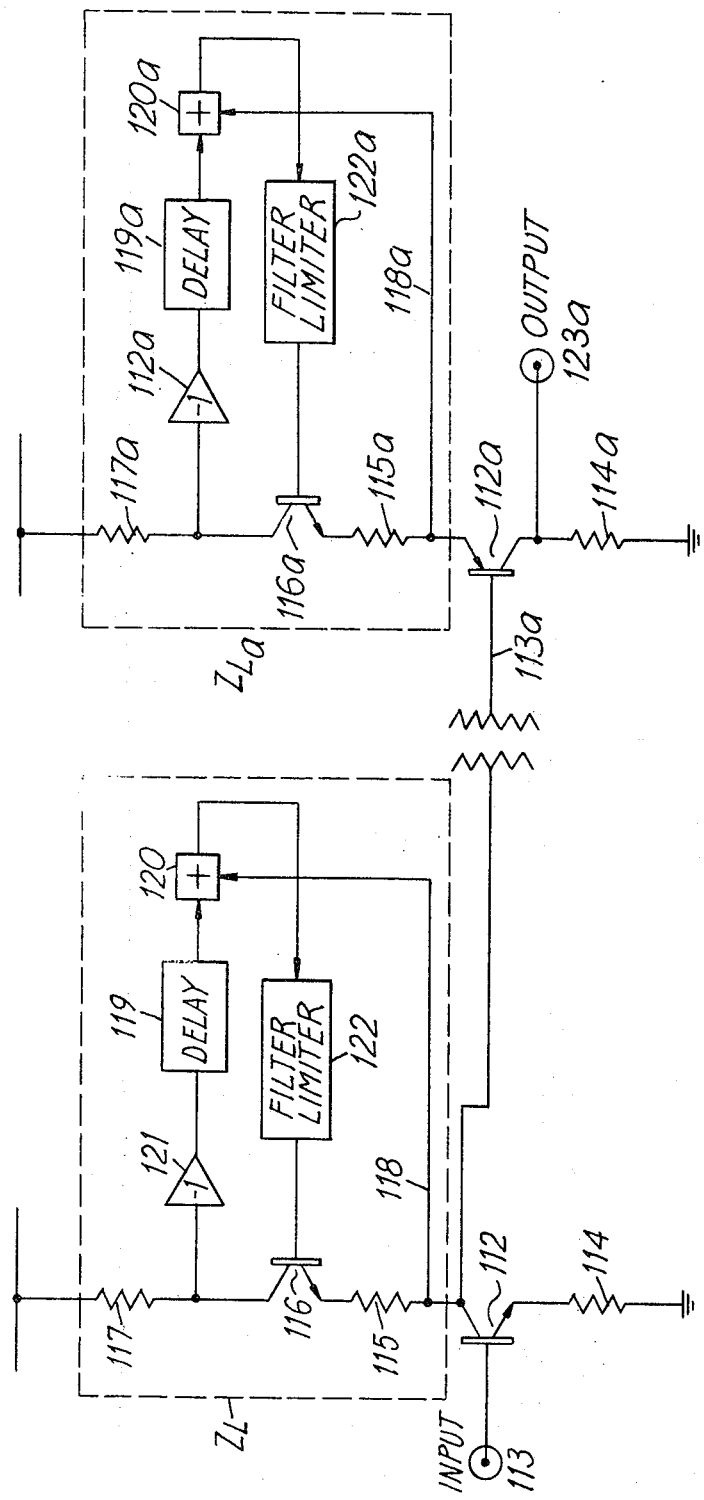
FIG. 29 shows a modification of FIG. 28.

FIG. 29 represents an example of the series mode configuration in which there is only one identifiable two-terminal impedance network ($Z_L$). Both the main signal component and the dynamically modified component are derived and combined within the two-terminal impedance network. This particular example is included because it has the capability of providing a useful amount of noise reduction using only a single delay means. It is equivalent in performance to the type 2.2 circuit in the parallel mode (FIG. 6).

Considering the encoder of FIG. 29, the input of the direct further path (118) is a voltage taken from a point at the collector of transistor 112, (i.e. the encoder output as is appropriate for the type 2.2 circuit) and this voltage is applied to the combining means 120. The input to the delayed further path is the current drive provided by transistor 12 which produces a proportional voltage across resistor 117, the collector load of transistor 116. This voltage is inverted in 121 and delayed in 119 before combined with the direct further path in 120 and amplitude limited by 122 in the same manner as in FIG. 28. Thus, the difference component is introduced by transistor 116 and the main component is again dropped across the resistor 115.

Although the operation is essential as in FIG. 28, it is no longer appropriate to consider the resistor 115 and the part of the circuit above the network as two separate, series connected networks, because the connection 118 is made to the lower end of resistor 115. $Z_L$ is now to be regarded as a single network combining the functions of the two networks in FIG. 28.

In the decoder, the input of the direct further path 118*a* is a voltage taken from a point at the emitter of transistor 112. This voltage is effectively the input voltage to the decoder, again by analogy with FIG. 6 (type 2.2).

The compression and expansion action is caused by the variable impedance network $Z_L$ in the collector circuit of transistor 112 in the compressor and in the emitter circuit of transistor 112*a* in the expander just as in the system of FIG. 28. However, the direct further paths, unlike the delayed further paths, do not undergo voltage to current or current to voltage transformation.

Although a separate encoder and ecoder have been shown, it will be appreciated that a single circuit may be provided for switching between the two modes. The majority of the circuit will be common for both modes but the switching means will connect in the transistor 112 for the encoding mode and the transistor 112*a* for the decoding mode.

Figure 30:
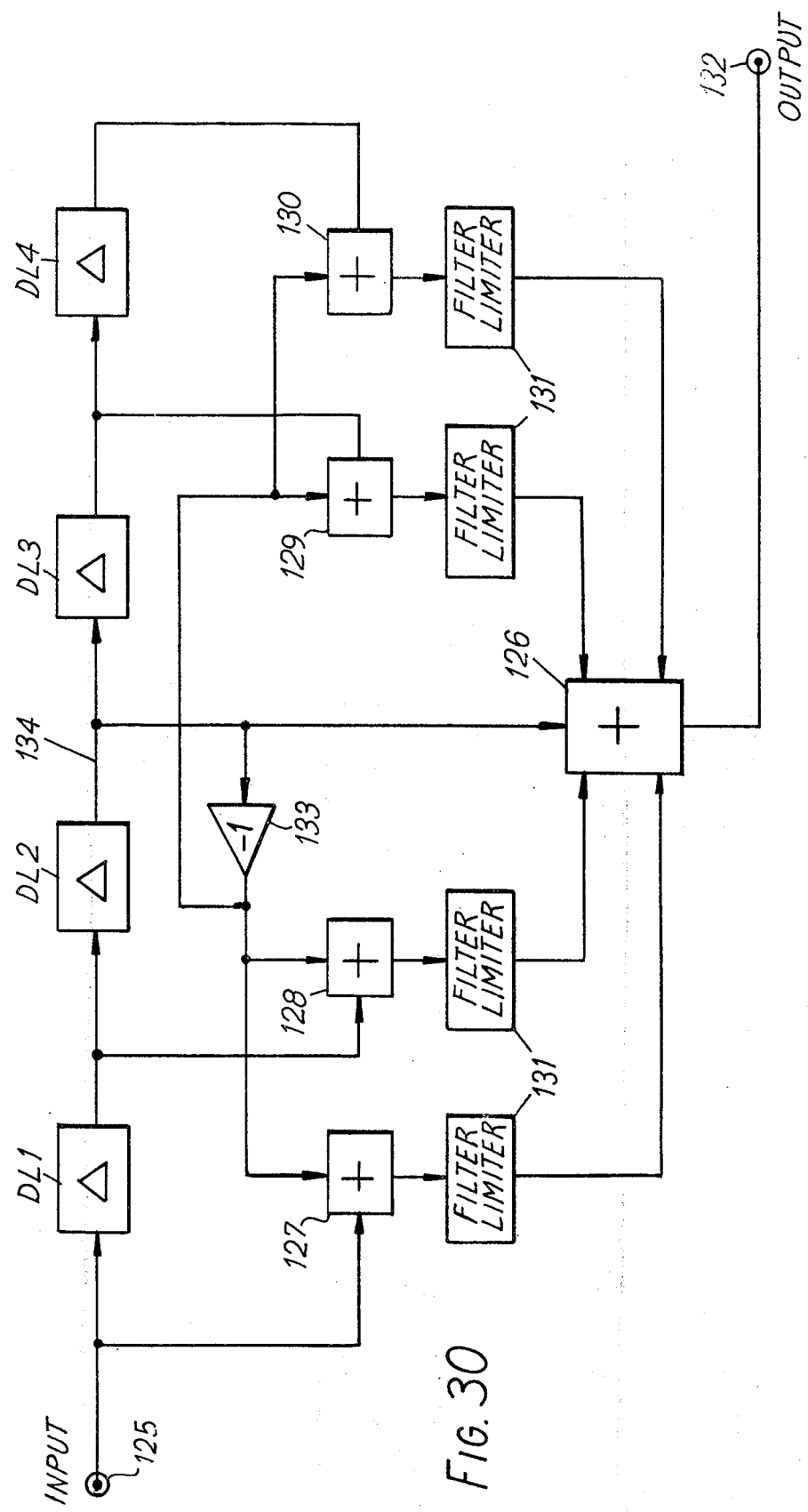
FIG. 30 shows a modified decoder using multiple delay paths.

In the multiple delay circuits described above, the main component is an undelayed, direct component. However, it is possible in a decoder to treat one of the delayed components as the main component as illustrated in FIG. 30. In FIG. 30, an input terminal 125 is connected to four cascaded delay lines DL1 to DL4 having equal delays. The output of the delay line DL2 is treated as a main component fed to a combining means 126 which also receives four difference signals provided by adders 127 to 130 and restricted by filter-limiters 131. The combined output of circuit 126 is provided at output terminal 132.

In order to yield decoder action, each adding means 127 to 130 receives the main component from delay line DL2 inverted by inverter 133. Adding means 127 forms the difference between the inverted main component and the undelayed input, adding means 128 forms the difference between the inverted main component and the output of delay line DL1, adding means 129 forms the difference between the inverted main component and the output of delay line DL3, and adding means 130 forms the difference between the inverted main component and the output of delay line DL4.

It will be appreciated that, downstream of the point marked 134 in FIG. 30, the circuit is the same in principle as that of FIG. 26 (save for the simplification that, in FIG. 30 only single filter-limiters 131 are shown in place of the pairs of high and low frequency filter-limiters 97 and 98 in FIG. 26. The essential difference between the two Figures lies in the additional delay means preceding point 134 in FIG. 30 and the added combining means 127 and 128 and associated filter-limiters 131.

We claim:
1. A circuit for modifying, within a predetermined frequency band, the dynamic range of an input signal having an input dynamic range with a predetermined upper limit, comprising a main signal circuit responsive to said input signal to transmit, at least within the predetermined frequency band, a main signal component from an input terminal to an output terminal, the main signal circuit including combining means, delay means coupled to the main circuit for delaying a second signal component derived from the main circuit, and a further circuit including means for forming within the predetermined frequency band the difference signal between a third signal component derived from the main circuit and the delayed version of the second signal component derived from the main circuit, the delay of the delayed second signal component delaying the second signal component relative to the third signal component, and the output of said further circuit coupled to said combining means so as to combine with the main component the said difference signal, which difference signal modifies the main component when said difference signal exists, and means for restricting the said difference signal to a predetermined amplitude which is not greater than about one-tenth the amplitude of the main component existing at the predetermined upper limit of the input dynamic range.

2. A circuit according to claim 1, comprising a frequency selective filter operative on the difference signal.

3. A circuit according to claim 1, for operating on a television signal component, wherein the delay of the delayed version of the signal is equal to a small fraction of a line period of the television signal.

4. A system for modifying the dynamic range of a colour television signal, comprising a colour decoder for decoding the television signal into a plurality of baseband components, a plurality of circuits, each in accordance with claim 1, for modifying the dynamic range of the respective baseband components, and a colour encoder responsive to the outputs of the said plurality of circuits.

5. A system for reducing noise introduced into a television signal by a standards converter which converts the signal from first standards to second standards, comprising a first circuit according to claim 1 preceding the standards converter and wherein said combining means combine the difference signal of said first circuit in a sense such as to boost the main component of said first circuit, and a second circuit according to claim 1 following the standards converter and wherein said combining means combine the difference signal of said second circuit in a sense such as to buck the main component of said second circuit, the delay of the first circuit bearing a predetermined relationship to the first standards and the delay of the second circuit bearing the corresponding relationship to the second standards.

6. A circuit according to claim 1, wherein the further circuit comprises a plurality of channels including filter means defining different regions of the frequency band of the difference signal, the said restricting means comprising a plurality of individual restricting means in the said channels respectively, and wherein said combining means combine with the main component the restricted components provided by all the said channels.

7. A circuit according to claim 1, wherein the second and third signal components are derived from a single point in the main circuit.

8. A circuit according to claim 7, wherein said point is on the output side of said combining means, and said combining means combine the difference signal in a sense such as to boost the main component, whereby the circuit acts to compress the dynamic range.

9. A circuit according to claim 7, wherein said point is on the input side of said combining means, and said combining means combine the difference signal in a sense such as to buck the main component, whereby the circuit acts to expand the dynamic range.

10. A circuit according to claim 7, wherein said point is on the input side of said combining means, and said combining means combine the difference signal in a sense such as to boost the main component, whereby the circuit acts to compress the dynamic range.

11. A circuit according to claim 7, wherein said point is on the output side of said combining means, and said combining means combine the difference signal in a sense such as to buck the main component, whereby the circuit acts to expand the dynamic range.

12. A circuit according to claim 1, for operating on a television signal component, wherein the delay of the delayed version signal is substantially equal to one or more line periods of the television signal.

13. A circuit according to claim 12, for operating on a television signal including a chrominance subcarrier component, comprising means for effecting fine adjustment of the delay to match an offset of the subcarrier.

14. A circuit according to claim 1, for operating on a television signal component, wherein the delay of the delayed version signal is substantially equal to one or more field periods of the television signal.

15. A circuit according to claim 14, comprising means for effecting fine adjustment of the field delay.

16. A system for modifying the dynamic range of a television signal, comprising a plurality of circuits, each in accordance with claim 1, including filter means preceding the input terminals of said circuits and selecting different parts of the television signal frequency band, the delay of each said circuit bearing a predetermined relationship to the line and field periods of the television signal.

17. A system according to claim 16, wherein one delay is substantially equal to one or more line periods and another delay is substantially equal to one or more field periods.

18. A circuit according to claim 1, wherein the restricting means includes a filter on the output of which a limiting means is directly operative as an element of said filter, the variation of impedance of said limiting means consequent upon limiting action thereof affecting the characteristics of the filter so as to narrow the pass-band of the filter on the appearance of signal components exceeding the predetermined amplitude, thereby to effect the said restriction of the difference signal.

19. A circuit according to claim 18, wherein the limiting means is a diode limiter.

20. A circuit according to claim 19, comprising means responsive to a signal derived from a point in said modifying circuit to provide a bias signal to the diode limiter of such sense as to reduce the limiting level thereof as the signal level at said point in the circuit increases.

21. A circuit according to claim 1, wherein the restricting means is a diode limiter.

22. A circuit according to claim 21, comprising means responsive to a signal derived from a point in said modifying circuit to provide a bias signal to the diode limiter of such sense as to reduce the limiting level thereof as the signal level of said point in the circuit increases.

23. A circuit according to claim 22, comprising means for limiting the bias signal to a level such that the limiting level of the diode limiter is not reduced below zero.

24. A circuit according to claim 1, wherein the third signal component is derived from a first point in the main circuit and the second signal component is derived from a second different point in the main circuit.

25. A circuit according to claim 24, wherein the said points in the main circuit are on opposite sides of said combining means, the further circuit being coupled to the first and second points by way of direct and delay circuit paths, respectively, of which the delay path includes the delay means.

26. A circuit according to claim 25, wherein the first and second points are respectively on the input side and output side of said combining means and wherein said combining means combine the difference signal in a sense such as to boost the main component, whereby the circuit acts to compress the dynamic range.

27. A circuit according to claim 25, wherein the first and second points are respectively on the output side and input side of said combining means and wherein said combining means combine the difference signal in a sense such as to buck the main component, whereby the circuit acts to expand the dynamic range.

28. A circuit according to claim 25 wherein the first and second points are respectively on the output side and input side of said combining means and wherein said combining means combine the difference signal in a sense such as to boost the main component, whereby the circuit acts to compress the dynamic range.

29. A circuit according to claim 25, wherein the first and second points are respectively on the input side and output side of said combining means and wherein said combining means combine the difference signal in a sense such as to buck the main component, whereby the circuit acts to expand the dynamic range.

30. A circuit according to claim 25, wherein the direct and delay circuit paths include frequency selective filters having the same characteristics.

31. A circuit according to claim 25, wherein the direct and delay circuit paths include frequency selective filters having different characteristics.

32. A circuit according to claim 25, for use with a periodic signal with a period nominally equal to the delay of the delay path, comprising means for comparing the phases of signal components from the delay and direct paths and operative automatically to adjust the delay of the delay path so as to tend to reduce any phase error between said components to zero.

33. A circuit according to claim 25, wherein one of the delay and direct paths includes gain adjusting means so settable that a steady signal component whose period equals the delay of the delay means contributes no component to the difference signal.

34. A circuit according to claim 33, wherein the gain adjusting means comprise means for deriving time averaged signals from the delay and direct paths, means for differencing the time averaged signals to derive an error signal, and means for automatically adjusting the gain of one of the delay and direct paths in response to the error signal so as to tend to reduce the error signal to zero.

35. A circuit according to claim 33, wherein the gain adjusting means adjust the gain of the delay path.

36. A circuit according to claim 25, wherein the delay path includes a plurality of delay means arranged to provide a corresponding plurality of signals delayed by a succession of delay times whose values form an arithmetic progression, the further circuit includes means for forming the difference signals between the signal provided by the direct path and each of the plurality of signals provided by the different delays of the delay path and a plurality of means for restricting the amplitudes of the respective difference signals to said predetermined amplitude, and said combining means combine all the difference signals with the main component.

37. A circuit according to claim 36, wherein the delay path includes a plurality of delay means in series, each having the same delay, and wherein the said plurality of signals are derived from the outputs of the delay means.

38. A circuit according to claim 36, for operating on a television signal component, wherein the delay path includes a first plurality of delay means providing signals delayed by multiples of a television line period and a second plurality of delay means providing signals delayed by multiples of a television field period.

39. A circuit for modifying the dynamic range of an input signal having an input dynamic range with a predetermined upper limit, comprising a main signal circuit responsive to said input signal to transmit a main signal component from an input terminal to an output terminal, the main signal circuit including combining means, and a plurality of further circuits, each including means for delaying a signal derived from a point in the main circuit, means for forming the difference signal between a signal derived from a point in the main circuit and its corresponding delayed signal derived from a point in the main circuit, and an output coupled to said combining means in the main circuit so as to combine with the main component the said difference signal, which difference signal modifies the main component when said difference signal exists, and each further circuit including means for restricting the said difference signal thereof to a predetermined amplitude which is not greater than about one-tenth the amplitude of the main component existing at the predetermined upper limit of the input dynamic range.

40. A dynamic range modifying circuit according to claim 39, wherein the main signal circuit is connected to the input terminal through at least one delay means, and wherein said dynamic range modifying circuit includes at least one additional further circuit including means for forming the difference signal between a signal derived from a point in the main signal circuit and a signal derived from the input to said at least one delay means, and means for amplitude restricting this difference signal, said combining means combining all the restricted difference signals, including that from said at least one additional circuit, with the main component so as to buck the main component signal when the combined, restricted difference signals exist.

41. A noise reduction system comprising a circuit for modifying the dynamic range of an input signal having an input dynamic range having a predetermined upper limit, the circuit comprising a main signal circuit responsive to said input signal to transmit, at least within the predetermined frequency band, a main signal component from an input terminal to an output terminal the main signal circuit including combining means, delay means coupled to the main circuit for delaying a second signal component from the main circuit, and a further circuit including means for forming within the predetermined frequency band the difference signal between a third signal component derived from the main circuit and the delayed version of the second signal component derived from the main circuit, the delay of the delayed second signal component delaying the second signal component relative to the third signal component, and the further circuit having an output coupled to said combining means in the main circuit so as to combine with the main component the said difference signal, which difference signal modifies the main component when said difference signal exists, means for restricting the said difference signal to a predetermined amplitude which is not greater than about one-tenth the amplitude of the main component existing at the predetermined upper limit of the input dynamic range, and switching means operable to place the dynamic range modifying circuit selectively in a compressor configuration in which said combining means combine said difference signal in a sense such as to boost said main component and an expander configuration in which said combining means combine said difference signal in a sense such as to buck said main component.

42. A system according to claim 41, wherein the difference signal is formed between a signal at a first terminal and a delayed version of a signal at a second terminal, and wherein the switching means connect the first and second terminals to points in the main circuit respectively preceding and following said combining means in the compressor configuration of the circuit and to points in the main circuit respectively following and preceding said combining means in the expander configuration of the circuit.

43. A system according to claim 41, wherein the difference signal is formed between a signal at a first terminal and a delayed version of a signal at a second terminal, and wherein the switching means connect the first and second terminals to points in the main circuit respectively following and preceding said combining means in the compressor configuration of the circuit and to points in the main circuit respectively preceding and following said combining means in the expander configuration of the circuit.

44. A system according to claim 41, wherein the difference signal is formed between a signal derived from a terminal connected to the main circuit and a delayed version of the same signal, and wherein the switching means connect the terminal to a point in the main circuit preceding said combining means in the compressor configuration of the circuit and to a point in the main circuit following said combining means in the expander configuration of the circuit.

45. A system according to claim 41, wherein the difference signal is formed between a signal derived from a terminal connected to the main circuit and a delayed version of the same signal, and wherein the switching means connect the terminal to a point in the main circuit which follows said combining means in the compressor configuration of the circuit and to a point in the main circuit which precedes said combining means in the expander configuration of the circuit.

46. A noise reduction system for reducing noise in signals within an input dynamic range having a predetermined upper limit and comprising a compressor circuit responsive to an input signal and feeding an information channel and an expander circuit fed by the information channel, the compressor circuit comprising a first main signal circuit responsive to said input signal to transmit at least within a predetermined frequency band a main, first signal component from an input terminal to an output terminal said first main signal circuit including first combining means, delay means coupled to the first main circuit for delaying a second signal component derived from the first main circuit, and a first further circuit including means for forming within the predetermined frequency band a first difference signal between a third signal component derived from the first main circuit and the delayed version of the second signal component derived from the first main circuit and an output coupled to said first combining means in the first main circuit so as to combine with the main, first component the first difference signal, in a sense such that the first difference signal boosts the main, first component when said difference signal exists, and first means for restricting the first difference signal to a predetermined amplitude which is not greater than about one-tenth the amplitude of the first main component existing at the predetermined upper limit of the input dynamic range, and the expander circuit comprising a second main signal circuit responsive to a signal from said output terminal of said compressor circuit to transmit at least within the predetermined frequency band a main, fourth signal component from an input terminal to an output terminal said second main signal circuit including second combining means, delay means coupled to the second main circuit for delaying a fifth signal component derived from the second main circuit, and a second further circuit including means for forming within the predetermined frequency band a second difference signal between a sixth signal component derived from the second main circuit and the delayed version of the fifth signal component derived from the second main circuit, and an output coupled to said second combining means in the second main circuit so as to combine with the main, fourth component the second difference signal, in a sense such that the second difference signal bucks the second main component when said second difference signal exists, and second means for restricting the second difference signal to a predetermined amplitude which is not greater than about one-tenth the amplitude of the second main component existing at the prdetermined upper limit of the input dynamic range.

47. A system according to claim 46, wherein each difference signal is formed between a signal derived from a first point in the corresponding main circuit and a delayed version of a signal derived from a different point in the corresponding main circuit, and wherein the first point and different point respectively precede and follow said first combining means in the compressor circuit and respectively follow and precede said second combining means in the expander circuit.

48. A system according to claim 46, wherein each difference signal is formed between a signal derived from a first point in the corresponding main circuit and a delayed version of a signal derived from a different point in the corresponding main circuit, and wherein the first point and different point respectively follow and precede said first combining means in the compressor circuit and respectively precede and follow said second combining means in the expander circuit.

49. A system according to claim 46, wherein each difference signal is formed between a signal derived from a point in the corresponding main path and a delayed version of the same signal, and wherein the said point precedes said first combining means in the compressor circuit and follows said second combining means in the expander circuit.

50. A system according to claim 46, wherein each difference signal is formed between a signal derived from a point in the corresponding main circuit and a delayed version of the same signal, and wherein the said point follows said first combining means in the compressor circuit and precedes said second combining means in the expander circuit.

51. A circuit for modifying, within a predetermined frequency band, the dynamic range of an input signal having an input dynamic range with a predetermined upper limit, comprising a main signal circuit responsive to said input signal to transmit, at least within the predetermined frequency band, a main signal component from an input terminal to an output terminal, said main signal circuit including combining means, and a further circuit including an electron beam tube, means for scanning the screen of the tube with a beam, means for modulating the beam in accordance with an input signal derived from a point in the main circuit, said scanning following a raster whose field period establishes a predetermined delay, and a circuit for coupling from the screen of the tube a difference signal generated as the scanning beam rewrites over the signal written in the preceding raster, and the further circuit having an output coupled from said coupling circuit to said combining means in the main circuit so as to combine with the main component the said difference signal, which difference signal modifies the main component when said difference signal exists, and means for restricting the said difference signal to a predetermined amplitude which is not greater than about one-tenth the amplitude of the main component existing at the predetermined upper limit of the input dynamic range.

52. A circuit according to claim 51, wherein the electron beam tube is a charge storage tube comprising a circuit for draining charge from the screen of the tube and means for illuminating the screen of the tube substantially constantly and uniformly.

53. A circuit according to claim 52, comprising means for combining with the difference signal, as derived from the screen of the tube, such a proportion of the input signal as cancels the component of the difference signal created by the drain of charge during the said delay.

54. A circuit for modifying, within a predetermined frequency band, the dynamic range of an input signal having an input dynamic range with a predetermined upper limit, comprising a main signal circuit responsive to said input signal to transmit, at least within the predetermined frequency band, a main signal component from an input terminal to an output terminal, and a further circuit including means for delaying a second signal component derived from the main circuit, and means for forming within the predetermined frequency band the difference signal between a third signal component derived from the main circuit and the delayed version of the second signal component derived from the main circuit, the delay of the delayed second signal component delaying the second signal component relative to the third signal component, variable impedance means connected in the main circuit as a series element of the main circuit, and the further circuit having an output coupled to the variable impedance means in the main circuit so as to vary said variable impedance means to superimpose on the main component the said difference signal, which difference signal modifies the main component when said difference signal exists, and means for restricting the said difference signal to a predetermined amplitude which is not greater than about one-tenth the amplitude of the main component existing at the predetermined upper limit of the input dynamic range.

55. A circuit according to claim 54, wherein the main signal circuit includes first and second impedance means connected in series with each other, current drive means series connected between the first and second impedance means and having a control terminal connected to said input terminal, said output terminal being connected between the current drive means and one of the first and second impedance means, the first impedance means including the series combination of said variable impedance means and a fixed impedance means, the further circuit having an input connected to a point between the fixed and variable impedance means and including means operative to form the difference signal between a signal component derived from said point and a delayed version of the same signal component, and the variable impedance means having a control terminal connected to the output of the further circuit.

56. A circuit according to claim 55, wherein the output terminal is connected between the current drive means and the first impedance means, the current drive means inverts the input signal, and the restricted difference signal reduces the conduction of the variable impedance means.

57. A circuit according to claim 55, wherein the output terminal is connected between the current drive means and the second impedance means, the current drive means inverts the input signal, the restricted difference signal reduces the conduction of the variable impedance means, and the first impedance means introduces variable negative feedback to the current drive means.

58. A method of modifying, within a predetermined frequency band, the dynamic range of an input signal having an input dynamic range with a predetermined upper limit, comprising the steps of providing, at least within the predetermined frequency band, a main signal component derived from the input signal, forming within the predetermined frequency band a difference signal between a second signal component derived from the input signal and a delayed version of a third signal component derived from the input signal, the delay of the delayed third signal component delaying the third signal component relative to the second signal component, combining the said difference signal with the main component to modify the main component when said difference signal exists, and restricting the said difference signal to a predetermined amplitude which is not greater than about one-tenth the amplitude of the main component existing at the predetermined upper limit of the input dynamic range.

59. A circuit for modifying, within a predetermined frequency band, the dynamic range of an input signal having an input dynamic range with a predetermined upper limit, comprising a drive circuit and a load circuit therefor, said drive circuit being responsive to said input signal to establish one of a voltage across and a current through said load circuit, and means for deriving an output signal from said load circuit in dependence upon the other of said voltage thereacross and current therethrough, said load circuit including first, non-variable impedance means providing a main signal component of said output signal and second, variable impedance means connected in series with said first impedance means providing a second, non-linear signal component of said output signal, said load circuit combining said main and second components to produce said output signal, said variable impedance means comprising means for deriving two signals from at least one point in said load circuit, delay means for delaying one of said two signals relative to the other, means for forming the difference signal between the delayed signal and said other signal, means for restricting said difference signal to provide said second component of said output signal, and said restricting means restricting said difference signal so that said second signal component of said output signal is restricted to a predetermined amplitude which is not greater than about one-tenth of the amplitude of said main component of said output signal existing at said predetermined upper limit of the input dynamic range.

* * * * *